(12) United States Patent
Andou

(10) Patent No.: US 9,355,941 B2
(45) Date of Patent: May 31, 2016

(54) SEMICONDUCTOR DEVICE WITH STEP PORTION HAVING SHEAR SURFACES

(71) Applicant: RENESAS ELECTRONICS CORPORATION, Kanagawa (JP)

(72) Inventor: Hideko Andou, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 14/797,887

(22) Filed: Jul. 13, 2015

(65) Prior Publication Data

US 2015/0325502 A1 Nov. 12, 2015

Related U.S. Application Data

(63) Continuation of application No. 14/053,038, filed on Oct. 14, 2013, now Pat. No. 9,111,922.

(30) Foreign Application Priority Data

Oct. 17, 2012 (JP) .................................. 2012-230186

(51) Int. Cl.
*H01L 23/495* (2006.01)
*H01L 23/00* (2006.01)
(Continued)

(52) U.S. Cl.
CPC ...... *H01L 23/49503* (2013.01); *H01L 21/4842* (2013.01); *H01L 21/56* (2013.01); *H01L 23/49513* (2013.01); *H01L 23/49524* (2013.01); *H01L 23/49541* (2013.01); *H01L 23/49551* (2013.01); *H01L 23/49562* (2013.01); *H01L 23/49575* (2013.01); *H01L 23/49582* (2013.01); *H01L 24/36* (2013.01); *H01L 24/37* (2013.01);

*H01L 24/40* (2013.01); *H01L 24/73* (2013.01); *H01L 24/83* (2013.01); *H01L 24/85* (2013.01); *H01L 24/89* (2013.01); *H01L 24/97* (2013.01); (Continued)

(58) Field of Classification Search
CPC .............. H01L 24/89; H01L 23/49575; H01L 23/49551; H01L 23/49562; H01L 23/49582; H01L 21/4842; H01L 23/49513; H01L 23/49524; H01L 24/97; H01L 24/37
USPC .......................................................... 438/14
See application file for complete search history.

(56) References Cited

U.S. PATENT DOCUMENTS 7,285,849 B2 10/2007 Cruz et al.
7,745,253 B2 6/2010 Luechinger
(Continued)

FOREIGN PATENT DOCUMENTS

| JP | 2004-336043 A | 11/2004 |
|---|---|---|
| JP | 2010-123686 A | 6/2010 |
| JP | 2011-223016 A | 11/2011 |

*Primary Examiner* — Walter H Swanson
(74) *Attorney, Agent, or Firm* — Foley & Lardner LLP

(57) ABSTRACT

A semiconductor device includes a source electrode pad formed to a front surface of a semiconductor chip and a metal clip (metal plate) to which a lead is electrically connected. The metal clip includes a chip-connecting portion electrically connected to the source electrode pad via a conductive bonding material, a lead-connecting portion electrically connected to the lead via a conductive bonding material, and an intermediate portion positioned between the chip-connecting portion and the lead-connecting portion. Further, between the intermediate portion and the chip-connecting portion, a step portion, which has shear surfaces disposed to face each other, is provided interposing a joining portion.

7 Claims, 28 Drawing Sheets

(51) Int. Cl.
*H01L 21/56* (2006.01)
*H01L 21/48* (2006.01)
*H01L 23/31* (2006.01)

(52) U.S. Cl.
CPC ... *H01L 23/3107* (2013.01); *H01L 2224/05624* (2013.01); *H01L 2224/05644* (2013.01); *H01L 2224/05647* (2013.01); *H01L 2224/32245* (2013.01); *H01L 2224/37013* (2013.01); *H01L 2224/40095* (2013.01); *H01L 2224/40245* (2013.01); *H01L 2224/40247* (2013.01); *H01L 2224/40249* (2013.01); *H01L 2224/48091* (2013.01); *H01L 2224/48106* (2013.01); *H01L 2224/48247* (2013.01); *H01L 2224/73221* (2013.01); *H01L 2224/73265* (2013.01); *H01L 2224/83801* (2013.01); *H01L 2224/83908* (2013.01); *H01L 2224/859* (2013.01); *H01L 2224/85399* (2013.01); *H01L 2224/85801* (2013.01); *H01L 2224/92246* (2013.01); *H01L 2224/97* (2013.01); *H01L 2924/00014* (2013.01); *H01L 2924/1301* (2013.01); *H01L 2924/1305* (2013.01); *H01L 2924/1306* (2013.01); *H01L 2924/13055* (2013.01); *H01L 2924/13091* (2013.01); *H01L 2924/181* (2013.01); *H01L 2924/1815* (2013.01); *H01L 2924/3011* (2013.01)

(56) References Cited

U.S. PATENT DOCUMENTS

| | | | |
|---|---|---|---|
| 8,058,107 | B2 | 11/2011 | Cruz et al. |
| 8,299,600 | B2 | 10/2012 | Sato et al. |
| 2004/0217488 | A1 | 11/2004 | Luechinger |
| 2005/0263869 | A1* | 12/2005 | Tanaka .................. H01L 21/563 257/686 |
| 2005/0269694 | A1 | 12/2005 | Luechinger |
| 2007/0114352 | A1 | 5/2007 | Victor R. Cruz et al. |
| 2007/0141755 | A1 | 6/2007 | Luechinger |
| 2007/0259514 | A1 | 11/2007 | Otremba |
| 2008/0044946 | A1 | 2/2008 | Cruz et al. |
| 2008/0265386 | A1* | 10/2008 | Muto ..................... H01L 24/84 257/676 |
| 2010/0123240 | A1 | 5/2010 | Sato et al. |
| 2010/0214754 | A1 | 8/2010 | Luechinger |
| 2013/0134577 | A1 | 5/2013 | Luechinger |

* cited by examiner

SEMICONDUCTOR DEVICE WITH STEP PORTION HAVING SHEAR SURFACES

CROSS-REFERENCE TO RELATED PATENT APPLICATIONS

Japan Priority Application 2012-230186, filed Oct. 17, 2012 including the specification, drawings, claims and abstract, is incorporated herein by reference in its entirety. This application is a Continuation of U.S. application Ser. No. 14/053,038, filed Oct. 14, 2013, incorporated herein by reference in its entirety.

BACKGROUND

The present invention relates to a semiconductor device and a method of manufacturing the same. For example, the present invention relates to technology effectively applied to a semiconductor device in which an electrode of a semiconductor chip and an external terminal are electrically connected via a metal plate.

Japanese Patent Application Laid-Open Publication No. 2011-223016 (Patent Document 1) describes a semiconductor device in which leads having a plurality of portions that are subjected to a bending processing are connected to an electrode pad.

In addition, Japanese Patent Application Laid-Open Publication No. 2010-123686 (Patent Document 2) describes a semiconductor device in which an electrode pad and leads of a semiconductor chip are electrically connected via a metal plate.

Further, Japanese Patent Application Laid-Open Publication No. 2004-336043 (Patent Document 3) describes a method of connecting a metal clip for electrically connecting an electrode pad and leads of a semiconductor chip by ultrasonic bonding.

SUMMARY OF THE INVENTION

Inventors of the present invention have been studied on performance improvement of what is called a power semiconductor device that is a semiconductor device built in a power circuit and the like. In the power semiconductor device, an electrode of a semiconductor chip and a lead that is an external terminal are electrically connected via a metal plate so that an impedance component of a conduction path can be reduced as compared with connecting via a wire that is a thin metal wire. However, since the above-mentioned metal plate is electrically connected to the electrode and lead of the semiconductor chip via a conductive bonding material, the inventor of the present invention has found out that the metal plate may pose a problem in reliability of the semiconductor device depending on the shape of the metal plate.

Other problems and novel characteristics of the present invention will be apparent from the description of the present specification and the accompanying drawings.

A semiconductor device according to an embodiment includes a metal plate for electrically connecting an electrode formed on a surface of a semiconductor chip and a lead. The metal plate includes a chip-connecting portion that is electrically connected to the electrode via a first conductive bonding material, a lead-connecting portion that is electrically connected to the lead via a second conductive bonding material, and an intermediate portion positioned between the chip-connecting portion and the lead-connecting portion. Further, a first step portion having first and second shear surfaces that are located on the opposite side to each other and a connecting portion is interposed between them is provided between the intermediate portion and the chip-connecting portion.

According to the embodiment, reliability of a semiconductor device can be improved.

Figure 1:
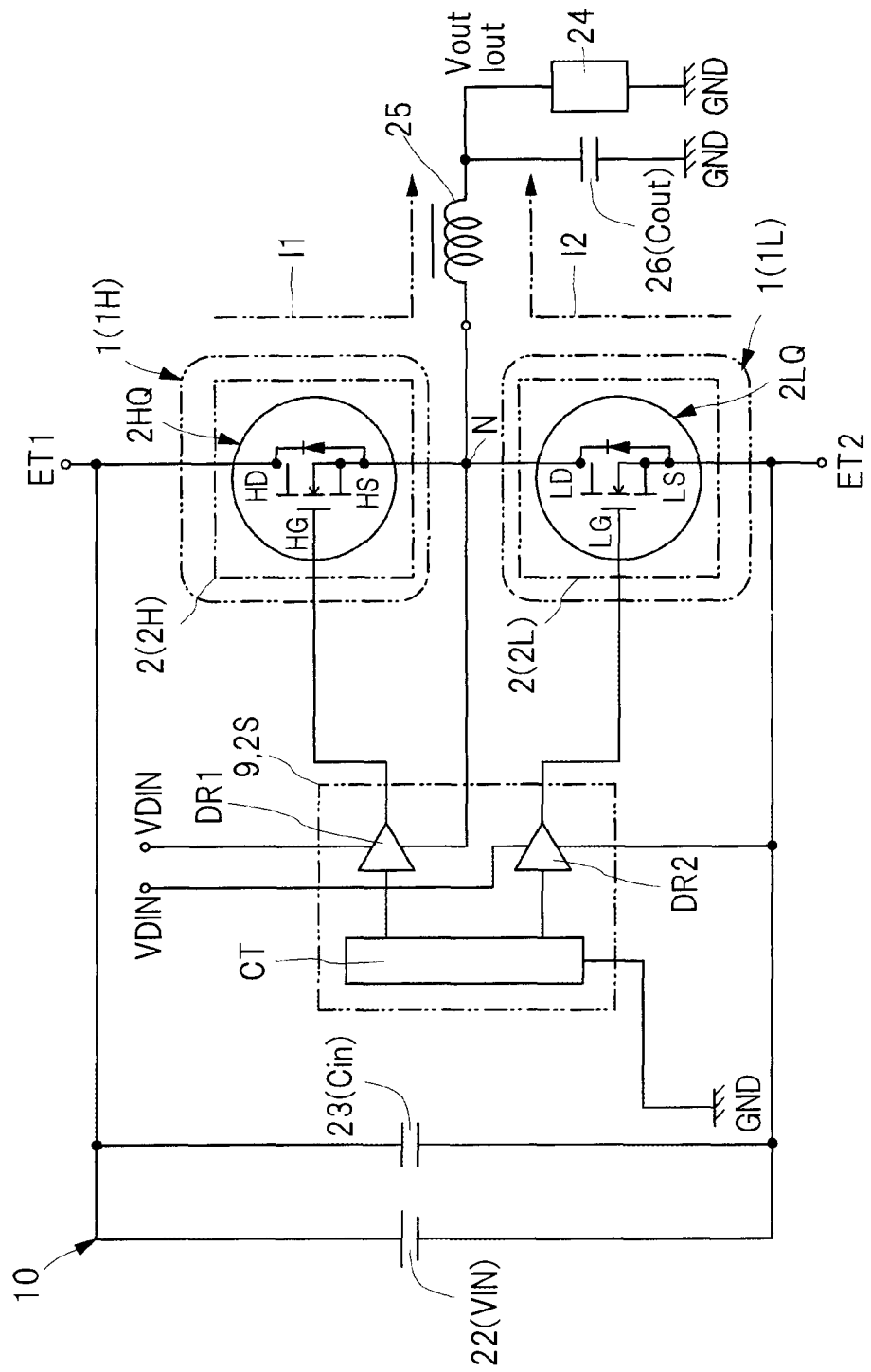
FIG. 1 is an explanatory diagram illustrating a configuration example of a power circuit in which a semiconductor device is built.

DETAILED DESCRIPTION (Description of Form, Basic Terms, Usage)

In the present application, while descriptions of the embodiments will be divided into a plurality of sections for convenience if necessary, the sections are not independently separate to each other, and regardless of the order of the descriptions, each section relates to a single example, the one relates to details or a part of the other or a modification example of a part or the entire of the other. Also, in principle, repetitive descriptions of the same parts will be omitted. Moreover, each component in the embodiments is not mandatory unless otherwise particularly stated that it is, unless the value is theoretically limited, and unless it is clearly not the case from the context.

In the same manner, in the descriptions of the embodiments etc., when an expression "X formed of A" is used regarding materials, compositions, etc., other elements than A will not be excluded unless otherwise particularly indicated that it is not the case and unless it is clearly not the case from the context. For example, as to component, it means that "X contains A as a main component" or the like. For example, it is needless to say that a term "a silicon member" or the like does not limit to pure silicon but includes a member containing SiGe (silicon germanium) alloy, other multicomponent alloys containing silicon as a main component, other additives, etc. Further, the terms such as gold plating, Cu (copper) layer, nickel, plating, etc. are not only pure ones unless otherwise particularly specified that they are, and include members containing gold, Cu, nickel etc. as main components, respectively.

Also, when referring to values and numbers, the number larger or smaller than a specified number is also applicable unless otherwise particularly stated that it is not the case, unless the number is theoretically limited to a specific number in principle and unless it is clearly limited from the context.

Further, components having the same function are denoted by the same or similar reference symbols throughout the drawings for describing the embodiments, and the repetitive description thereof will be omitted in principle.

Still further, in the attached drawings, when the drawing is complicated or a gap or void clearly distinguishable, hatching etc. may be omitted even when the drawing is a cross-sectional view. In relation to this, when descriptions etc. are clear, even a hole that is closed in a plan view, a contour line on the background may be omitted. Moreover, even when the drawing is not a cross-sectional view, to clearly denote that a part is not a gap or void or to clearly denote a boundary between regions, hatching or a dot pattern may be added.

Embodiment

Circuit Configuration Example

In a present embodiment, as an example of a semiconductor device in which a metal plate is bonded to an electrode of a semiconductor chip, a semiconductor device built in a power circuit of, for example, electronic equipment as a switching circuit will be picked up and described. In addition, as an aspect of a semiconductor package, an aspect of using the semiconductor package as a SON (Small Outline Non-leaded Package) type of a semiconductor device in which a part of a chip-mounting portion and a plurality of leads are partially exposed at a lower surface of a sealant in a square planar shape will be picked up and described.

FIG. 1 is an explanatory diagram illustrating a configuration example of a power circuit in which the semiconductor device described in the embodiment is built. Note that, in FIG. 1, as an example of a power circuit in which the semiconductor device of the present embodiment is built, a configuration example of a switching circuit (for example, a DC-DC converter) is illustrated.

A power circuit 10 is a power-supply device which converts or adjusts power using a ratio of on and off time (duty ratio) of a semiconductor switching element. In the example illustrated in FIG. 1, the power circuit 10 is a DC-DC converter which converts a direct current to another direct current at a different value. Such a power circuit 10 is used as a power circuit in electronic equipment.

The power circuit 10 includes a plurality of semiconductor devices 1 (two in FIG. 1) in which a semiconductor switching element is embedded, and a semiconductor device 9 having a control circuit CT for controlling driving of the semiconductor device 1. Also, the power circuit 10 includes an input power supply 22 and an input capacitor 23 which is a power supply for temporally charging energy (charges) supplied from the input power supply 22 and supplying the energy to a main circuit of the power circuit 10. The input capacitor 23 and the input power supply 22 are connected in parallel.

Also, the power circuit 10 includes a coil 25 which is an element for supplying power to an output of the power circuit 10 (input of a load 24) and an output capacitor 26 electrically connected between an output wiring connecting the coil 25 and the load 24 and a terminal for supplying a reference voltage (for example, ground potential GND). The coil 25 is electrically connected to the load 24 via an output wiring.

Note that VIN in FIG. 1 denotes an input power, GND denotes a reference voltage (for example, 0 V at a ground potential), Iout denotes an output current, and Vout denotes an output voltage. In addition, Cin in FIG. 1 denotes the input capacitor 23 and Cout denotes the output capacitor 26.

The semiconductor device 9 includes two driver circuits DR1 and DR2, and a control circuit CT for transmitting a control signal to each of the driver circuits DR1 and DR2. Also, the semiconductor device 1 includes high-side and low-side field-effect transistors as switching elements. In more detail, a high-side semiconductor device 1H includes a high-side MOSFET (Metal Oxide Semiconductor Field-Effect Transistor) 2HQ. Also, a low-side semiconductor device 1L includes a low-side MOSFET 2LQ.

Figure 2:
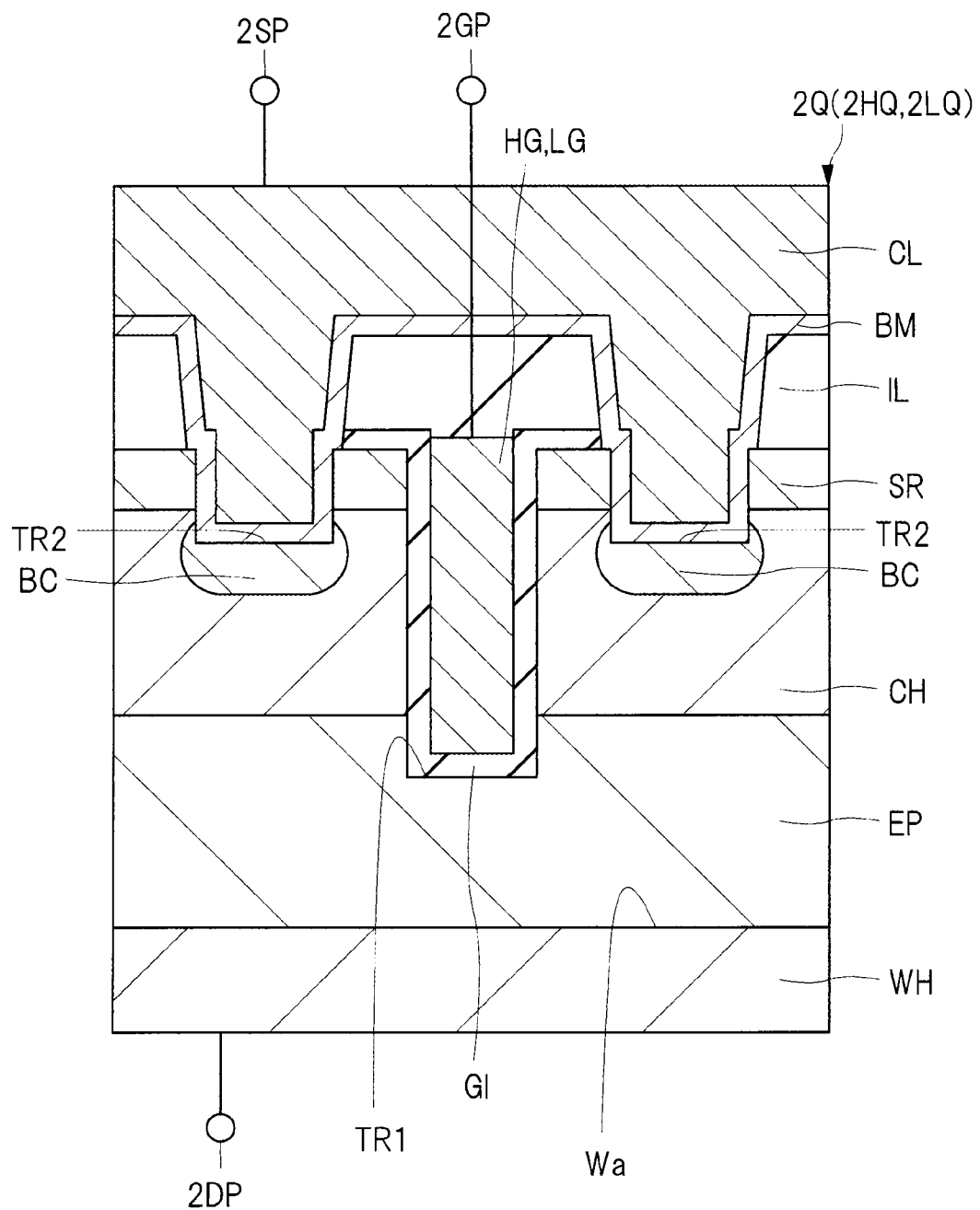
FIG. 2 is a cross-sectional view of a main part illustrating an element configuration example of a field-effect transistor illustrated in FIG. 1.

In FIG. 2, as an example of a power transistor, a MOSFET will be picked up and described. However, various modification examples can be used as the power transistor. For example, instead of the MOSFETs 2HQ and 2LQ illustrated in FIG. 11, an insulated gate bipolar transistor (IGBT) can be used.

Further, the MOSFET mentioned above is described as a term widely means a field-effect transistor having a structure in which a gate electrode formed of a conductive material is disposed on a gate insulator. Thus, citing "MOSFET" does not exclude a gate insulator other than an oxide film. Moreover, citing "MOSFET" does not exclude a "gate electrode material" other than a metal, for example, polysilicon.

The control circuit CT is a circuit for controlling operation of the MOSFETs 2HQ and 2LQ and configured with, for example, a PWM (Pulse Width Modulation) circuit. The PWM circuit outputs a PWM signal (control signal) after comparing an instruction signal and magnitude of a triangle wave. An output voltage (a width (On time) in which voltage switches of the MOSFETs 2HQ and 2LQ are on) of the MOSFETs 2HQ and 2LQ (i.e., the power circuit 10) is controlled.

An output of the control circuit CT is electrically connected to inputs of the driver circuits DR1 and DR2 via wirings formed to the semiconductor chip 2S included in the semiconductor device 9. Outputs of the driver circuits DR1 and DR2 are electrically connected to a gate electrode HG of the MOSFET 2HQ and a gate electrode LG of the MOSFET 2LQ, respectively.

The driver circuits DR1 and DR2 are circuits which control potentials of the gate electrodes HG and LG of the MOSFETs 2HQ and 2LQ, respectively, in accordance with pulse width modulation (PWM) signals supplied from the control circuit CT to control operations of the MOSFETs 2HQ and 2LQ. An output of one driver circuit DR1 is electrically connected to the gate electrode HG of the MOSFET 2HQ. An output of the other driver circuit DR2 is electrically connected to the gate electrode LG of the MOSFET 2LQ. The control circuit CT and the two driver circuits DR1 and DR2 are formed into a single semiconductor chip 2S, for example. Note that VDIN denotes an input power supply to the driver circuits DR1 and DR2.

In addition, the MOSFETs 2HQ and 2LQ, which are power transistors, are connected in series between the terminal (first power terminal) ET1 for supplying high voltage (first power voltage) of the input power supply 22 and a terminal (second power terminal) ET2 for supplying a reference voltage (second power voltage). In addition, to a wiring connecting a source HS of the MOSFET 2HQ of the power circuit 10 and the drain LD of the MOSFET 2LQ, an output node N for supplying an output power voltage to the outside is provided. The output node N is electrically connected to the coil 25 via an output wiring and further electrically connected to the load 24 via the output wiring.

That is, the MOSFET 2HQ has a path of its source HS and drain HD being connected between in series the terminal ET1 for supplying high voltage of the input power supply 22 and the output node (output terminal) N. In addition, the MOSFET 2LQ has a path of its source LS and drain LD being connected in series between the output node N and the terminal ET2 for supplying reference voltage. Note that, in FIG. 1, parasitic diodes (inner diodes) are illustrated in the MOSFETs 2HQ and 2LQ, respectively.

In the power circuit 10, conversion of power voltage is performed by alternately switching on and off in synchronization by the MOSFETs 2HQ and 2LQ. That is, when the high-side MOSFET 2HQ is On, a current (first current) I1 flows to the output node N from the terminal ET1 via the MOSFET 2HQ. On the other hand, when the high-side MOSFET 2HQ is Off, a current I2 flows as being caused by a reverse voltage of the coil 25. When the low-side MOSFET 2LQ is turned on while the current I2 is flowing, voltage drop can be reduced.

The MOSFET (first field-effect transistor; power transistor) 2HQ is a field-effect transistor for a high-side switch (high-voltage side: first operating voltage; hereinafter, simply called as "high side") and functions as a switch for charging energy in the coil 25. The high-side MOSFET 2HQ is formed to a semiconductor chip 2H different from the semiconductor chip 2S.

On the other hand, the MOSFET (second field-effect transistor; power transistor) 2LQ is a field-effect transistor for low-side switch (low-voltage side: second operating voltage; hereinafter, simply called as "low side") and has a rectifying function by decreasing resistance of the transistor in synchronization with frequency from the control circuit CT. That is, the MOSFET 2LQ is a rectifying transistor of the power circuit 10.

Also, as illustrated in FIG. 2, the high-side MOSFET 2HQ and the low-side MOSFET 2LQ are formed of, for example, n-channel field-effect transistors. FIG. 2 is a cross-sectional view of main parts illustrating an element structure example of the field-effect transistors illustrated in FIG. 1.

In the example illustrated in FIG. 2, an n-type epitaxial layer EP is formed on a main surface Wa of a semiconductor substrate WH formed of, for example, n-type single crystal silicon. The semiconductor substrate WH and the epitaxial layer EP form the drain regions (the drains HD and LD illustrated in FIG. 1) of the MOSFETs 2HQ and 2LQ. The drain region is electrically connected to a drain electrode 2DP formed on a back surface side of semiconductor chips 2H and 2L illustrated in FIG. 1.

A channel-forming region CH which is a p-type semiconductor region is formed on the epitaxial layer EP, and a source region SR which is an n+-type semiconductor region is formed on the channel-forming region CH. And, a trench (opening portion, groove) TR1 penetrating through the channel-forming region CH from an upper surface of the source region SR and reaching inside of the epitaxial layer EP is formed.

In addition, a gate insulator GI is formed on an inner wall of the trench TR1. Also, on the gate insulator GI, the stacked gate electrodes HG and LG are formed so as to fill in the trench TR1 are formed. The gate electrodes HG and LG are electrically connected to a gate electrode pad 2GP of semiconductor chips 2H and 2L illustrated in FIG. 1 via lead wirings not illustrated.

In addition, next to the trench TR1 in which the gate electrodes HG and HL are buried, across the source region SR, a trench (opening portion, groove) TR2 for body contacting is formed. In the example illustrated in FIG. 2, the trench TR2 is formed to both sides of the trench TR1. Also, to a bottom portion of the trench TR2, a body contact region BC which is a p+-type semiconductor region is formed. By providing the body contact region BC, it is possible to reduce a base resistance of a parasitic bipolar transistor taking the source region SR as an emitter region, the channel-forming region CH as a base region, and the epitaxial layer EP as a collector region.

Note that, in the example illustrated in FIG. 2, by forming the trench TR2 for body contact, a position of an upper surface of the body contact region BC is positioned below a lower surface of the source region SR (on a lower surface side of the channel-forming region). However, although not illustrated, as a modification example, the body contact region BC may be formed at almost the same height as the source region SR without forming the trench TR2 for body contacting.

In addition, an insulator IL is formed on the source region SR and the gate electrodes HG and LG. On the insulator IL and in a region of the trench TR2 for body contacting including the inner wall, a barrier conductive film BM is formed. Also, a wiring CL is formed on the barrier conductive film BM. The wiring CL is electrically connected to the source electrode pad 2SP formed on surfaces of the semiconductor chips 2H and 2L illustrated in FIG. 1.

Also, the wiring CL is electrically connected to both of the source region SR and the body contact region BC via the barrier conductive film BM. That is, the source region SR and the body contact region BC are at the same potential. In this manner, it is possible to suppress turning on of the parasitic bipolar transistors mentioned above due to a potential difference between the source region SR and the body contact region BC.

Channels of the MOSFETs 2HQ and 2LQ are formed in the thickness direction because the drain regions and the source region SR are disposed in the thickness direction interposing the channel-forming region CH (hereinafter, called as "vertical channel structure"). In this case, as compared with a field-effect transistor in which a channel is formed along a main surface Wa, an occupying area of the element in a plan view can be reduced. Thus, by using the vertical channel structure described above to the high-side MOSFET 2HQ, a planar size of the semiconductor chip 2H (see FIG. 1) can be reduced.

In the case of the vertical channel structure described above, by making the thickness of the semiconductor chip 2 smaller, an On-resistance can be reduced. Particularly, On-time during operation (time during applying a voltage) of the low-side MOSFET 2LQ is longer than that of the high-side MOSFET 2HQ and thus loss due to the On-resistance seems to be larger than a switching loss. Accordingly, by using the vertical channel structure to the low-side MOSFET 2LQ, the On-resistance of a low-side field-effect transistor can be reduced. As a result, this manner is preferable in the point that the voltage conversion efficiency can be improved even when a current flowing in the power circuit 10 illustrated in FIG. 1 is increased.

Note that, FIG. 2 is a diagram illustrating an element structure of a field-effect transistor in which a plurality of field-effect transistors having the element structure as illustrated in FIG. 2 are connected in parallel in the semiconductor chips 2H and 2L illustrated in FIG. 1. In this manner, a power MOSFET in which a large current exceeding, for example, one ampere can be configured.

<Semiconductor Device>

Figure 3:
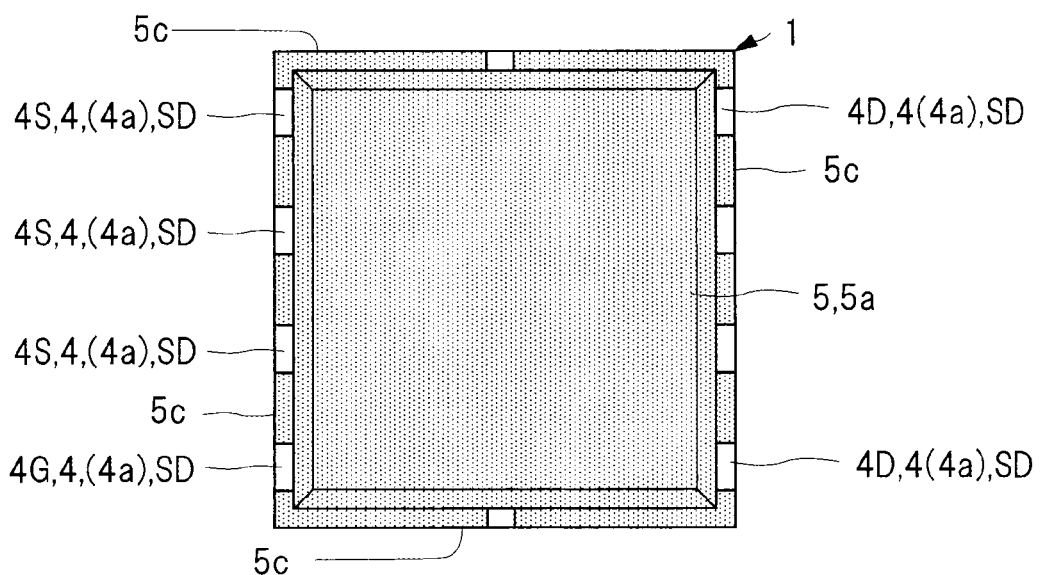
FIG. 3 is a top view of the semiconductor device illustrated in FIG. 1.
Figure 4:
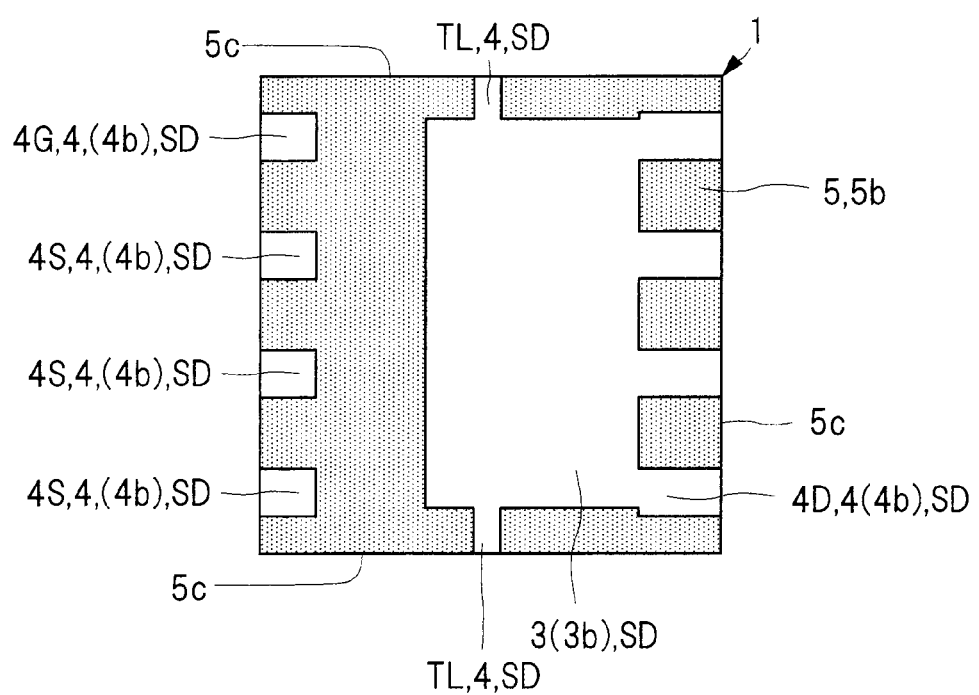
FIG. 4 is a bottom view of the semiconductor device illustrated in FIG. 3.
Figure 5:
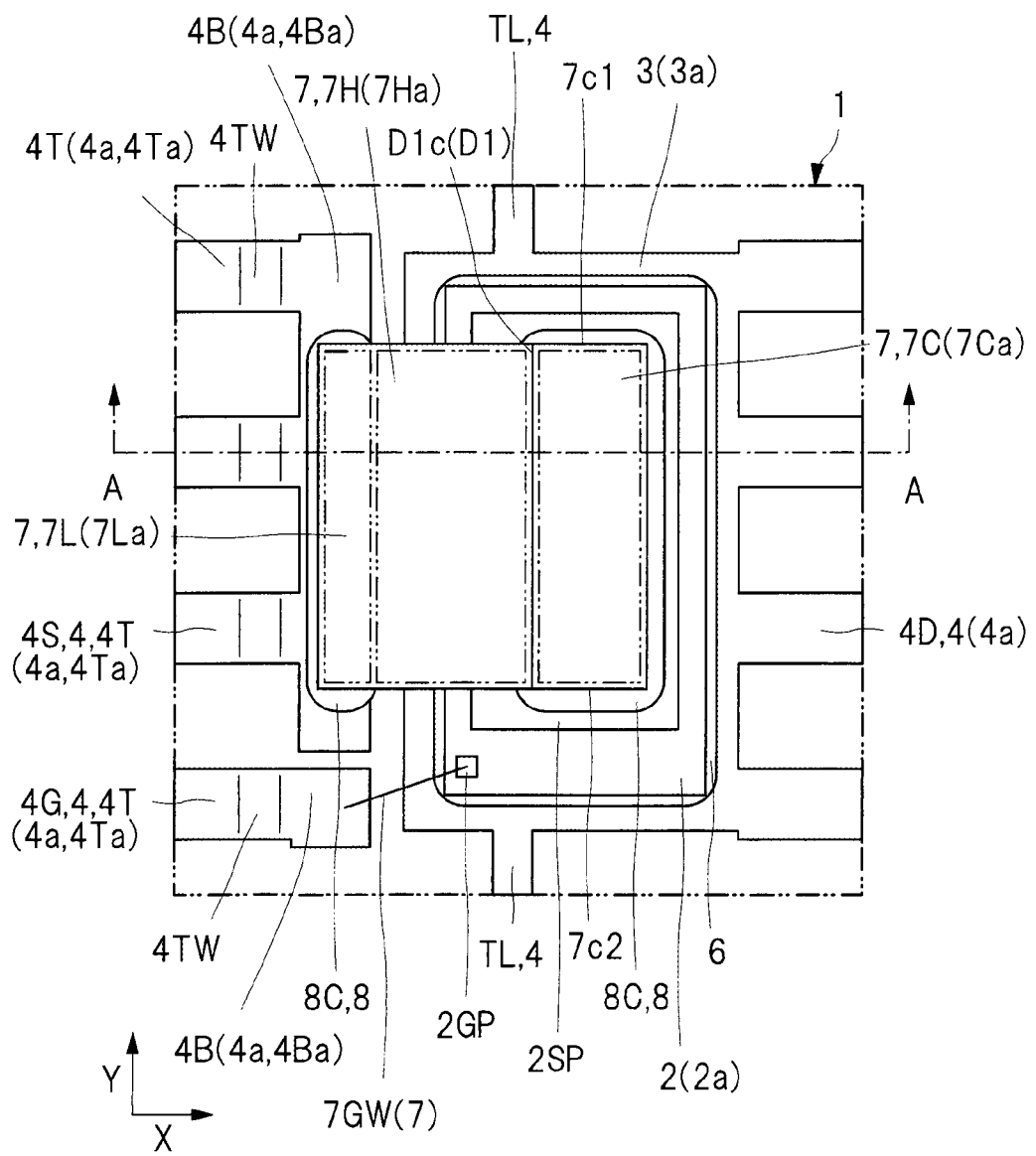
FIG. 5 is a plan view illustrating an inner structure of the semiconductor device in a state in which a sealant illustrated in FIG. 3 is omitted.
Figure 6:
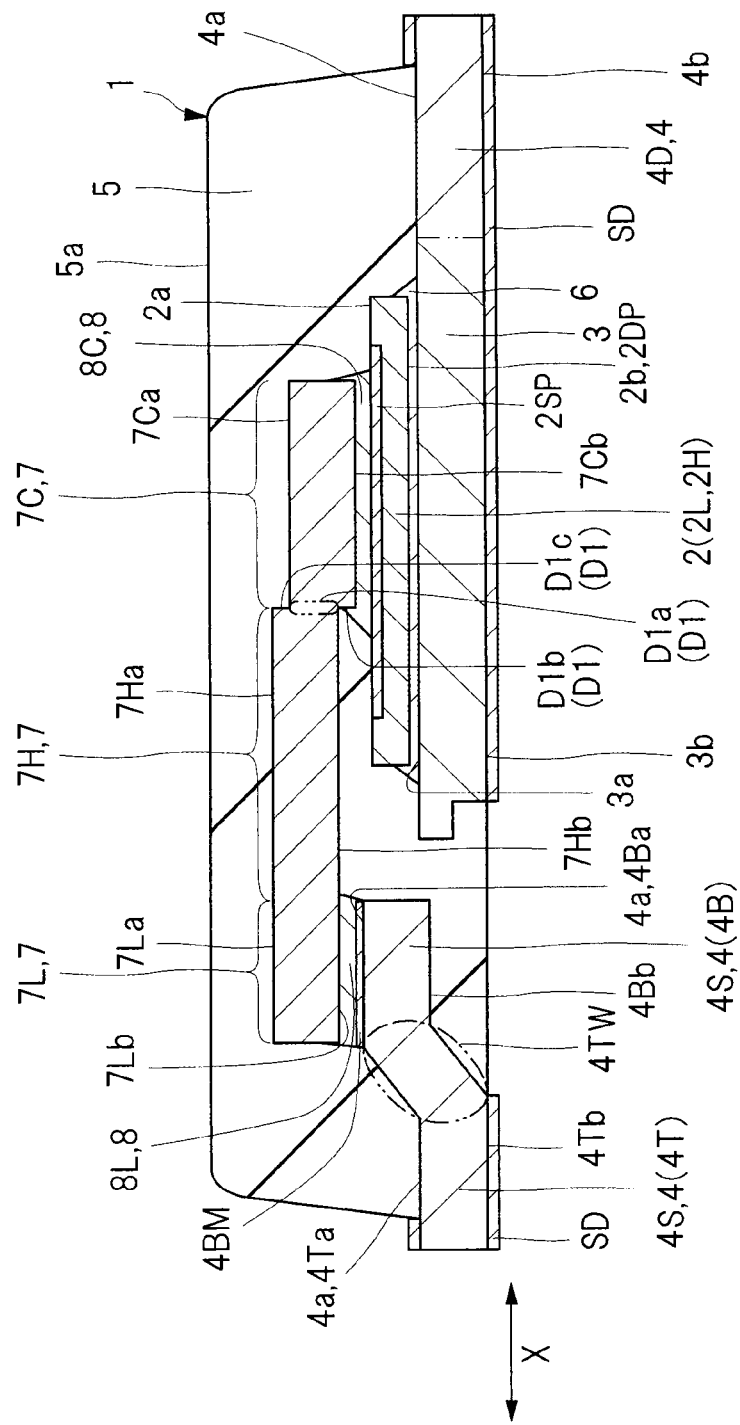
FIG. 6 is a cross-sectional view taken along an A-A line in FIG. 5.
Figure 7:
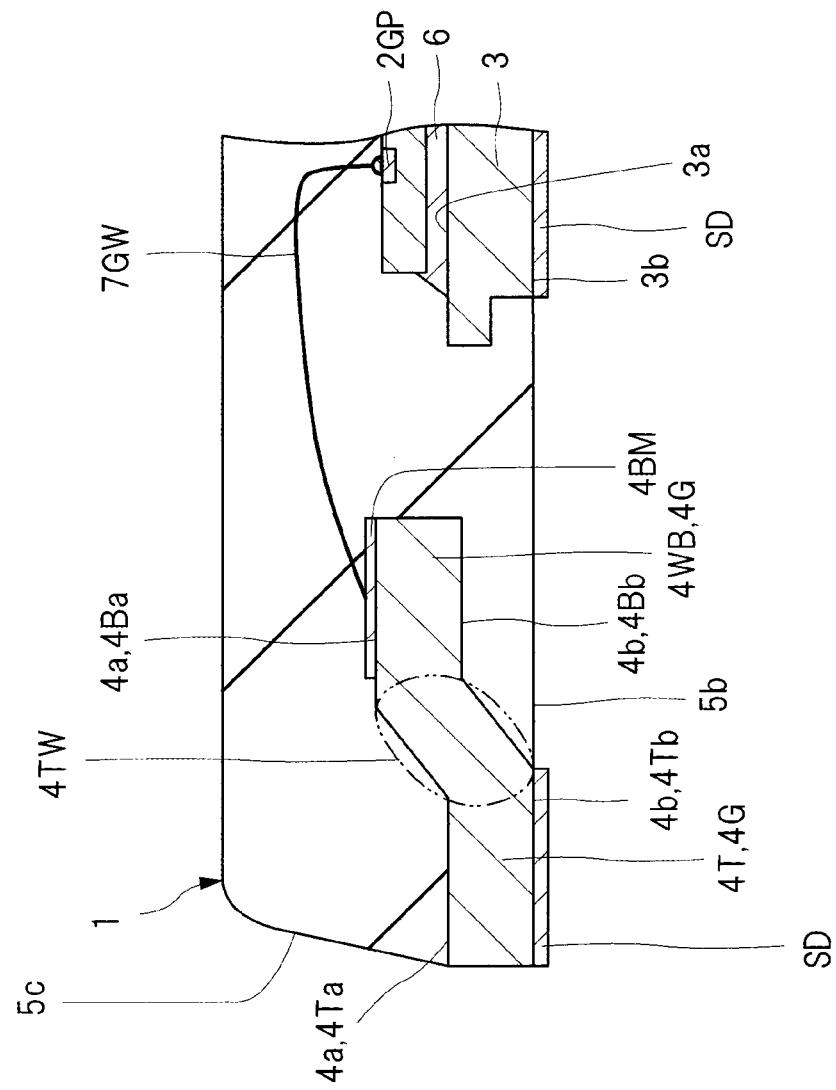
FIG. 7 is an enlarged cross-sectional view illustrating a connection state of a gate electrode and a lead of a semiconductor chip illustrated in FIG. 5.

Next, a package structure of the semiconductor device 1 illustrated in FIG. 1 will be described. FIG. 3 is a top view of the semiconductor device 1 illustrated in FIG. 1. FIG. 4 is a bottom view of the semiconductor device 1 illustrated in FIG. 3. FIG. 5 is a plan view illustrating an inner structure of the semiconductor device 1 in which a sealant illustrated in FIG. 3 is omitted. FIG. 6 is a cross-sectional view taken along an A-A line in FIG. 5. Finally, FIG. 7 is an enlarged cross-sectional view illustrating a connection state of the gate electrode and the lead of a semiconductor chip illustrated in FIG. 5.

As illustrated in FIGS. 3 to 7, the semiconductor device 1 includes the semiconductor chip 2 (see FIGS. 5 and 6), a tab 3 on which the semiconductor chip 2 is mounted (see FIGS. 4 to 6), and a plurality of leads 4 which are external terminals (see FIGS. 4 to 6). In addition, the semiconductor chip 2, an upper surface 3a of the tab 3, and an upper surface 4a of the plurality of leads are sealed by a sealant (resin body) 5 in block.

The semiconductor chip 2 corresponds to the semiconductor chip 2H in which the MOSFET 2HQ that is a high-side switching element or the semiconductor chip 2L in which the MOSFET 2LQ that is a low-side switching element of the power circuit 10 described with reference to FIG. 1. As illustrated in FIG. 6, the semiconductor chip 2 has a front surface 2a and a back surface 2b positioned on the opposite side of the front surface 2a. As illustrated in FIG. 5, to the front surface 2a of the semiconductor chip 2, a source electrode pad 2SP corresponding to the source HS or HL illustrated in FIG. 1 and a gate electrode pad 2GP corresponding to the gate electrode HG or LG illustrated in FIG. 1 are formed. On the other hand, as illustrated in FIG. 6, to the back surface 2b of the semiconductor chip 2, a drain electrode 2DP is formed corresponding to the drain HD or LD illustrated in FIG. 6. In the example illustrated in FIG. 6, the entire of the back surface 2b of the semiconductor chip 2 is the drain electrode 2DP.

As described above, when the semiconductor chip 2 is in the vertical channel structure, by making the thickness of the semiconductor chip 2 smaller (making the distance between the front surface 2a and the back surface 2b illustrated in FIG. 6 smaller), the On-resistance can be reduced. In the example illustrated in FIG. 6, the thickness of the semiconductor chip 2 is, for example, about 100 1 μm 150 μm.

As illustrated in FIGS. 5 and 6, the semiconductor device 1 includes the tab (chip-mounting portion) 3 to which the semiconductor chip 2 is mounted. As illustrated in FIG. 6, the tab 3 has an upper surface (chip-mounting surface) 3a to which the semiconductor chip 2 is mounted via a bonding material (conductive member) 6, and a lower surface (mounting surface) 3b on the opposite side of the upper surface 3a. As illustrated in FIG. 5, the tab 3 is integrally formed with a lead 4D which is a drain terminal. The lead 4D is an external terminal electrically connected to the drain HD or LD illustrated in FIG. 1 and connected to the terminal ET1 or the node N. As illustrated in FIG. 6, the drain electrode 2DP formed to the back surface 2b of the semiconductor chip 2 is electrically connected to the tab 3 via the conductive bonding material 6.

In the example illustrated in FIG. 5, a planar size (area of the front surface 2a) of the semiconductor chip 2 is smaller than that (area of the upper surface 3a) of the tab 3. As illustrated in FIGS. 4 and 6, the lower surface 3b of the tab 3 is exposed from the sealant 5 at a lower surface 5b of the sealant 5. To the exposed surface of the tab 3, upon mounting the semiconductor device 1 to a mounting board not illustrated, a metal film (outer plating film) SD for improving wetness of a solder material to be a bonding material is formed.

In this manner, by enlarging the planar size of the tab 3 and also exposing the lower surface 3b of the tab 3 from the sealant 5, heat-dissipation efficiency of heat generated from the semiconductor chip 2 can be improved. Also, by enlarging the planar size of the tab 3 and also exposing the lower surface 3b of the tab 3 from the sealant 5, an impedance component in the case of using the tab 3 as a part of an external terminal can be reduced.

By exposing the lower surface 3b of the tab 3 as the lead 4D that is an external terminal from the sealant 5, a cross section of a conduction path in which a current flows can be increased. Thus, impedance components in the conductive pat can be reduced. Particularly, the lead 4D is an external terminal corresponding to the output node N described with reference to FIG. 1. Thus, this manner is preferable in the point that power loss in the output wiring can be directly reduced by reducing the impedance components in the conduction path connected to the lead 4D.

In addition, the conductive bonding material 6 illustrated in FIGS. 5 and 6 is conductive member (die-bonding material) for fixing the semiconductor chip 2 on the tab 3 and electrically connecting the semiconductor chip 2 and the tab 3. As the conductive bonding material 6, a conductive resin material in which a plurality (number) of conductive particles such as silver (Ag) particles are contained in a thermosetting resin, such as a conductive resin material so-called silver (Ag) paste or a solder material can be used.

Upon mounting the semiconductor device 1 to a mounting board (mother board) not illustrated, the solder member is used as a bonding material electrically connecting the lead 4 of the semiconductor device 1 and a terminal not illustrated on the mounting board side. The metal film SD that is an outer plating film formed of, for example, solder illustrated in FIGS. 5 and 6 is formed to each of the bonding surface from a view point of improving the wetness of the solder member as a bonding material.

In a process of mounting the semiconductor device 1, to melt a solder material not illustrated and bond the solder material to the lead 4 and a terminal (not illustrated) on the mounting board side, respectively, a heating method called a reflow processing is performed. When using a conductive adhesive material in which conductive particles are mixed in a resin in which, as the conductive bonding material 6, even when the processing temperature of the reflow processing described above is optionally set, the conductive bonding material 6 is not melted. Thus, it is preferable that malfunctions due to remelting of the conductive bonding material at a bonding portion of the semiconductor chip 2 and the tab 3 upon mounting the semiconductor device 1 can be prevented.

Meanwhile, when using a solder material as the conductive bonding material 6, to suppress remelting upon mounting the semiconductor device 1, it is preferable to use a material having a higher melting point than the bonding material used upon mounting. In this manner, although there is a limitation in material selection when using a solder material to the conductive bonding material 6, a solder material is more preferable than a conductive bonding material because reliability of electric connection can be improved by a solder material than a conductive adhesive material.

Also, as illustrated in FIGS. 4 and 5, the tab 3 is supported by a plurality of leads 4 including a suspension lead TL. The suspension lead TL is a supporting member for fixing the tab 3 to a frame portion of a lead frame in a manufacturing process of the semiconductor device 1.

Also, as illustrated in FIGS. 5 and 6, the source electrode pad 2SP and a lead 4S of the semiconductor chip 2 are electrically connected via the metal clip (conductive member, metal plate) 7. The metal clip 7 is a conductive member corresponding to a wire for connecting between the source HS and the output node N of the high-side MOSFET 2HQ or between the source LS and the terminal ET2 of the low-side MOSFET 2LQ illustrated in FIG. 1. The metal clip is formed of, for example, copper (Cu).

The metal clip 7 includes a chip-connecting portion 7C electrically connected to the source electrode pad 2SP of the semiconductor chip 2 via a conductive bonding material 8C. Also, the metal clip 7 includes a lead-connecting portion 7L electrically connected to the lead 4S via a conductive bonding material 8L. The metal clip 7 includes an intermediate portion 7H positioned between the chip-connecting portion 7C and the lead-connecting portion 7L. The metal clip 7 has a length direction disposed along an X direction indicated in FIG. 5 connecting the source electrode pad 2SP and the lead 4S, and a width direction disposed along a Y direction orthogonal to the X direction.

Although details will be described later, the intermediate portion 7H includes a retained surface 7Ha which is retained by absorption by a retaining jig not illustrated when transferring the metal clip 7 in the manufacturing process of the semiconductor device 1. The chip-connecting portion 7C, the intermediate portion 7H, and the lead-connecting portion 7L are disposed along the X direction in a plan view as illustrated in FIG. 5 in and order of the chip-connecting portion 7C, the intermediate portion 7H, and the lead-connecting portion 7L from the source electrode pad 2SP of the semiconductor chip 2.

Since the metal clip 7 will be a conduction path for electrically connecting the source electrode pad 2SP and the lead 4S, the metal clip 7 is preferable to be thick in view of reducing a resistance component. In the example illustrated in FIG. 6, the thickness of the metal clip 7 is larger than that of the semiconductor chip 2 and it is about 200 μm, for example.

Detailed configuration and effects achieved by the configuration of the metal clip 7 will be described in detail later.

The conductive bonding materials 8L and 8C illustrated in FIGS. 5 and 6 are conductive members for fixing the metal clip 7 onto the lead 4S and the source electrode pad 2SP of the semiconductor chip 2 and electrically connecting between the semiconductor chip 2 and the metal clip 7 and between the lead 4S and the metal clip 7, respectively. As the conductive bonding materials 8L and 8C, for example, a conductive resin material so-called silver (Ag) paste in which a plurality of conductive particles such as silver (Ag) particles are contained in a thermosetting resin, or a solder member.

As illustrated in FIGS. 5 and 6, the semiconductor device 1 includes the lead (plate lead member) 4S which is an external terminal electrically connected to the semiconductor chip 2. The lead 4S includes a connecting portion (metal plate connecting portion) 4B connecting the metal clip 7, and a plurality of (three in FIG. 5) terminal portions 4T which will be a mounting portion upon mounting the semiconductor device 1 to a mounting board not illustrated. The plurality of terminal portions 4T are joined (connected) via the connecting portion 4B.

The connecting portion 4B has a connecting surface (metal plate connecting surface, upper surface) 4Ba to which the lead-connecting portion 7L of the metal clip 7 is connected via the conductive bonding material 8L, and a lower surface 4Bb positioned on the opposite side of the connecting surface 4Ba. The terminal portion 4T has a lower surface 4Tb which is a mounting surface, and an upper surface 4Ta positioned on the opposite side of the lower surface 4Tb. To the connecting surface 4Ba of the lead 4S, a metal film 4BM for improving wetness of the conductive bonding material 8C to the lead 4S is formed. The metal film 4BM is formed of a material having a better wetness to the conductive bonding material 8L (for example, solder) than a base material (for example, copper) of the lead 4S. The material can be, for example, silver (Ag) or nickel (Ni).

As illustrated in FIG. 6, a height of the connecting surface 4Ba of the connecting portion 4B of the lead 4S is at a higher position than that of the upper surface 4a of the terminal portion 4T of the lead 4S. In more detail, between the connecting surface 4Ba of the connecting portion 4B and the upper surface 4a of the terminal portion 4T, a bending portion (or inclined portion) 4TW is provided so that the height of the connecting surface 4Ba is higher than that of the upper surface 4a of the terminal portion 4T. Thus, the lower surface 4Bb of the connecting portion 4B is covered by the sealant 5. In other words, the connecting portion 4B of the lead 4S is sealed by the sealant 5. In this manner, by sealing a part of the lead 4S by the sealant 5, it is difficult for the lead 4S to fall off from the sealant 5. As a result, electrical connection reliability of the semiconductor device 1 can be improved.

As illustrated in FIGS. 5 and 7, next to the tab 3, a lead 4G which is an external terminal electrically connected to the gate electrode pad 2GP of the semiconductor chip 2 is disposed. The lead 4G is provided to be separated from the tab 3. As illustrated in FIG. 7, the lead 4G includes the connecting portion (wire-connecting portion) 4B which is a bonding region to which the wire 7GW is bonded, and a terminal portion 4T to be an external terminal upon mounting the semiconductor device 1 to a mounting board not illustrated.

As illustrated in FIG. 7, the height of the connecting surface 4Ba of the connecting portion 4B is at a higher position than that of an upper surface 4Ta of the lead 4G on the opposite side of the lower surface 4Tb that is a mounting surface of the lead 4G. In more detail, between the connecting surface 4Ba of the connecting portion 4B and the upper surface 4Ta of the terminal portion 4T, a bending portion (or inclined portion) 4TW is provided so that the height of the connecting surface 4Ba is higher than that of the upper surface 4a of the terminal portion 4T. Thus, in the same manner as the lead 4S, the connecting portion 4B of the lead 4G is sealed by the sealant 5. In this manner, by sealing a part of the lead 4G by the sealant 5, it is difficult for the lead 4G fall off from the sealant 5. As a result, electrical connection reliability of the semiconductor device 1 can be improved.

There are various modification examples in the shape in which the lower surface 4Bb of the connecting portion 4B of the lead 4S illustrated in FIG. 6 and the lead 4G illustrated in FIG. 7 is sealed by the sealant 5, respectively, such as a method of subjecting the leads 4S and 4G to a bending processing or an etching processing. In the example illustrated in FIGS. 6 and 7, a method of subjecting part of the leads 4S, 4G to a bending processing is used. Thus, a thickness of the connecting portion 4B is the same as that of the terminal portion 4T. In other words, in the thickness direction of the leads 4S and 4G, a thickness from the connecting surface 4Ba to the lower surface 4Bb immediately below the connecting surface 4Ba is the same as that from the upper surface 4Ta of the terminal portion 4T to the lower surface 4Tb immediately below the upper surface 4Ta. In this manner, the method of subjecting the lead 4S and 4G to a bending processing is preferable in the easiness in processing at a stage of manufacturing a lead frame.

The lead 4G and the gate electrode pad 2GP are electrically connected to the driver circuit DR1 illustrated in FIG. 1 or an output terminal of the driver circuit DR2. Also, to the lead 4G and the gate electrode pad 2GP, a signal for controlling potential of the gate electrode HG of the MOSFET 2HQ illustrated in FIG. 2 or the gate electrode LG of the MOSFET 2LQ illustrated in FIG. 2 is supplied. Thus, as compared with other leads 4 (the leads 4D, 4S illustrated in FIG. 5), a current flowing in the lead 4G is relatively small. Thus, the lead 4G and the gate electrode pad 2GP are electrically connected via the wire (conductive member) 7GW which is a thin metal line.

For example, in the example illustrated in FIG. 7, one end of the wire 7GW (for example, first bonding portion) formed of gold (Au) is bonded to a metal film (for example, an aluminum film, or gold film) formed to the top-most surface of the gate electrode pad 2GP. Also, to the connecting surface 4Ba of the connecting portion 4B of the lead 4G, the metal film 4BM capable of improving connection strength of the base material of the wire 7GW and the lead 4G is formed. In addition, the other end (for example, second bonding portion) of the one end of the wire 7GW is electrically connected to the base material of the lead 4F via the metal film 4BM. The base material of the lead 4G is formed of, for example, copper (Cu) and the metal film 4BM is formed of, for example, silver (Ag).

Currents flowing in the leads 4S and 4D are larger than that flowing in the lead 4G. Thus, in view of enlarging the cross section area of the conduction path to reduce a resistance component, in the example illustrated in FIGS. 5 and 6, the metal clip 7 having a larger cross section than the wire 7GW is electrically connected to the lead 4S. Also, the entire of the drain electrode 2DP of the semiconductor chip 2 is covered by the conductive bonding material 6 on the tab 3, so that the tab 3 and the lead 4D are integrally formed. In this manner, using electrical different connection methods in accordance with magnitude of currents flowing in the plurality of lead 4, the package size of the semiconductor device 1 can be reduced and also power conversion efficiency can be improved.

Also, since the lead 4S, the lead 4D, and the tab 3 are conduction paths in which large currents flow, in view of reducing resistance components in the conduction paths, it is preferable to make them thick. In the example illustrated in FIG. 6, thicknesses of the plurality of leads 4 and the tab are 200 μm to 250 μm, respectively. Note that, in the manufacturing method of the semiconductor device 1, since the plurality of leads 4 and the tab 3 are formed by processing one metal plate, the thicknesses of the plurality of leads 4 and the tab 3 are the same. For example, as described above, while a relatively smaller current flows in the lead 4G as compared with the leads 4S and 4D, the thickness of the lead 4G is the same as those of the leads 4S and 4D and the tab 3. In addition, since the bending portion 4TW of the lead 4 illustrated in FIG. 6 or 7 is formed by a bending processing, the bending portion 4TW is formed to have a thickness substantially same as the terminal portion 4T and the connecting portion 4B.

As illustrated in FIG. 6, the semiconductor chip 2, the connecting portion 4B of the lead 4S, and the metal clip 7 are sealed by the sealant 5. As illustrated in FIG. 7, the connecting portion 4B of the lead 4G and the wire 7GW are sealed by the sealant 5.

The sealant 5 is a resin body for sealing the plurality of semiconductor chips 2, the metal clip 7, and the wire 7GW. The sealant 5 has an upper surface 5a (see FIGS. 3 and 6), and a lower surface (mounting surface) 5b positioned on the opposite side of the upper surface 5a. As illustrated in FIGS. 3, 4 and 5, the sealant 5 is in a square form in a plan view and has four side surfaces 5c.

The sealant 5 is mainly formed of, for example, a thermosetting resin such as epoxy-based resin. To improve characteristics (for example, expansion characteristics die to heal influence) of the sealant 5, for example, filler particles like silica (silicon dioxide: SiO2) particles may be mixed in the resin material in some cases.

<Details of Metal Clip>

Next, details of the metal clip 7 illustrated in FIGS. 5 and 6 will be described. As illustrated in FIGS. 5 and 6, a step portion D1 is provided between the intermediate portion 7H and the chip-connecting portion 7C of the metal clip 7. As illustrated in FIG. 6, by providing the step portion D1, a lower surface 7Cb of the chip-connecting portion 7C and a lower surface 7Lb of the lead-connecting portion 7L can be disposed at different heights. As a result, even when the heights of the connecting surface 4Ba and the front surface 2a (strictly, the front surface of the source electrode pad 2SP) of the semiconductor chip 2 are different, the height difference can be adjusted by the step portion D1.

In addition, when the step portion D1 is formed at the boundary of the intermediate portion 7H and the chip-connecting portion 7C, it is easy to control the level of spreading the conductive bonding material 8C. The conductive bonding material 8C is a conductive adhesive material or a solder material as described above, in both cases, there is a step of wetly spreading the conductive bonding material 8C along the lower surface 7Cb of the chip-connecting portion 7C of the metal clip 7 included in the manufacturing process. Thus, when the lower surface 7Cb of the chip-connecting portion 7C and the lower surface 7Hb of the intermediate portion 7H are continuously connected at the same height, it is easy for the liquid (or paste-like) conductive bonding material 8C to wetly spread along the lower surface 7Hb of the intermediate portion 7H.

On the other hand, as illustrated in FIG. 6, when the step portion D1 is provided at the boundary of the intermediate portion 7H and the chip-connecting portion 7C, the lower surface 7Hb of the intermediate portion 7H is positioned at a higher position than the lower surface 7Cb of the chip-connecting portion 7C. Thus, it is difficult for the conductive bonding material 8C to wetly spread to the intermediate portion 7H side. That is, by providing the step portion D1 at the boundary of the intermediate portion 7H and the chip-connecting portion 7C, control of the level of spreading the conductive bonding material 8C becomes easier.

Since the conductive bonding material 8C is a bonding material for electrically connecting the metal clip 7 and the source electrode pad 2SP of the semiconductor chip 2, in view of stabilizing electrical characteristics, it is preferable to make the close-contact area of the conductive bonding material 8C and the chip-connecting portion 7C large. By providing the step portion D1 as illustrated in FIG. 7, the level of spreading the conductive bonding material 8C can be controlled and thus the close-contact area of the chip-connecting portion 7C and the conductive bonding material 8C can be made large even when the amount of disposing the conductive bonding material 8C is made small.

In addition, when the close-contact area of the chip-connecting portion 7C and the conductive bonding material 8C are made large, the bonding strength of the chip-connecting portion 7C and the conductive bonding material 8C can be improved. As a result, connection reliability of the portion for connecting the chip-connecting portion 7C and the source electrode pad 2SP can be improved.

The conductive bonding material 8C is a conductive member disposed on the source electrode pad 2SP of the semiconductor chip 2. Thus, when the amount of disposing the conductive bonding material 8C is too much and the conductive bonding material 8C overruns from a circumference portion of the front surface 2a of the semiconductor chip 2, the conductive bonding material 8C goes around to the back surface 2b side. When the conductive bonding material 8C that is a conductive member goes around to the back surface 2b side of the semiconductor chip 2, there is a concern that the source electrode pad 2SP and the drain electrode 2DP comes into electrically connected (short-circuited). In the case of the semiconductor device 1, since the level of spreading the conductive bonding material 8C can be controlled by providing the step portion D1 as described above, such an electrical connection (short-circuiting) of the source electrode pad 2SP and the drain electrode 2DP via the conductive bonding material 8C can be prevented or suppressed.

On the other hand, in the example illustrated in FIG. 6, the heights of the lower surface 7Hb of the intermediate portion 7H and the lower surface 7Lb of the lead-connecting portion 7L are the same. Thus, a part of the conductive bonding material 8L may spread until the intermediate portion 7H. However, since the connecting portion 4B of the lead 4S is disposed at an inner tip (a position closest to the semiconductor chip 2) of the lead 4S, as long as the conductive bonding material 8L wetly spread until the edge portion of the connecting surface 4Ba, the conductive bonding material 8L hardly spread further. In addition, if the conductive bonding material 8L went round to the lower surface 4Bb side of the connecting portion 4B, there is no concern of short-circuiting of different terminals. Thus, the step portion D1 is not necessarily provided at the boundary of the intermediate portion 7H and the lead-connecting portion 7L.

As described above, the step portion D1 has a height-adjusting function of adjusting a height difference between the connecting surface 4Ba of the lead 4S and the front surface 2a of the semiconductor chip 2 and a spread-control function of controlling the level of spreading the conductive bonding material 8C. Out of the two functions, in considerations of only the height-adjusting function, when the height of the connecting surface 4Ba of the lead 4S is the same as the front surface 2a of the semiconductor chip 2, a configuration in which the step portion D1 is not provided is also conceivable. However, when the spread-control function is considered, even when the height of the connecting surface 4Ba of the lead 4S is the same as the front surface 2a of the semiconductor chip 2, it is preferable to provide the step portion D1. In this case, in accordance with needs, a height difference between the connecting surface 4Ba of the lead 4S and the front surface 2a of the semiconductor chip 2 can be adjusted by providing a step portion that is not illustrated also between the intermediate portion 7H and the lead-connecting portion 7L.

As described above, in view of stabilizing electrical characteristics or in view of improving electrical connection reliability, it is preferable to enlarge the close-contact area of the chip-connecting portion 7C and the conductive bonding material 8C. However, when enlarging the close-contact area of the chip-connecting portion 7C and the conductive bonding material 8C, since it is needed to dispose the conductive bonding material 8C more, it is important to control the direction in which the conductive bonding material 8C spreads not to make the conductive bonding material 8C overflow from the source electrode pad 2SP.

Accordingly, as illustrated in FIG. 5, when the source electrode pad 2SP is in a rectangular shape in a plan view, it is preferable to dispose the metal clip 7 so that the step portion D1 is disposed along a longitudinal side of the source electrode pad 2SP which is in a rectangular shape. In this manner, when the step portion D1 is formed along the width direction (Y direction in the example in FIG. 5) of the metal clip 7, the area of the chip-connecting portion 7C can be made wider.

In the example illustrated in FIG. 5, the metal clip 7 has a side surface 7c1 and a side surface 7c2 disposed to face each other in the X direction that is orthogonal to the Y direction. The step portion D1 is formed so as to connect the side surface 7c1 and the side surface 7c2. In other words, in the metal clip 7, the step portion D1 is formed across the width direction along the Y direction. Thus, even when the amount of disposing the conductive bonding material 8C is increased, the amount of the conductive bonding material 8C spreading in the direction of the lead 4S is limited by the step portion D1. That is, since the direction of spreading the conductive bonding material 8C can be controlled by the step portion D1 formed across the width direction of the metal clip 7, even when the amount of disposing the conductive bonding material 8C is increased, the conductive bonding material 8C can be retained on the source electrode pad 2SP.

In view of easily confirming a bonding state of the conductive bonding material 8C and the metal clip 7, the conductive bonding material 8C is preferable to be exposed at the side surfaces 7c1 and 7c2 of the metal clip 7 as illustrated in FIG.

5. In other words, the conductive bonding material 8C is preferable to cover at least a part of the side surface 7c1 and at least a part of the side surface 7c2. In this manner, the bonding state of the conductive bonding material 8C and the metal clip 7 can be easily visually confirmed. Thus, it is possible to reduce bonding malfunction and to improve reliability of the product.

Figure 30:
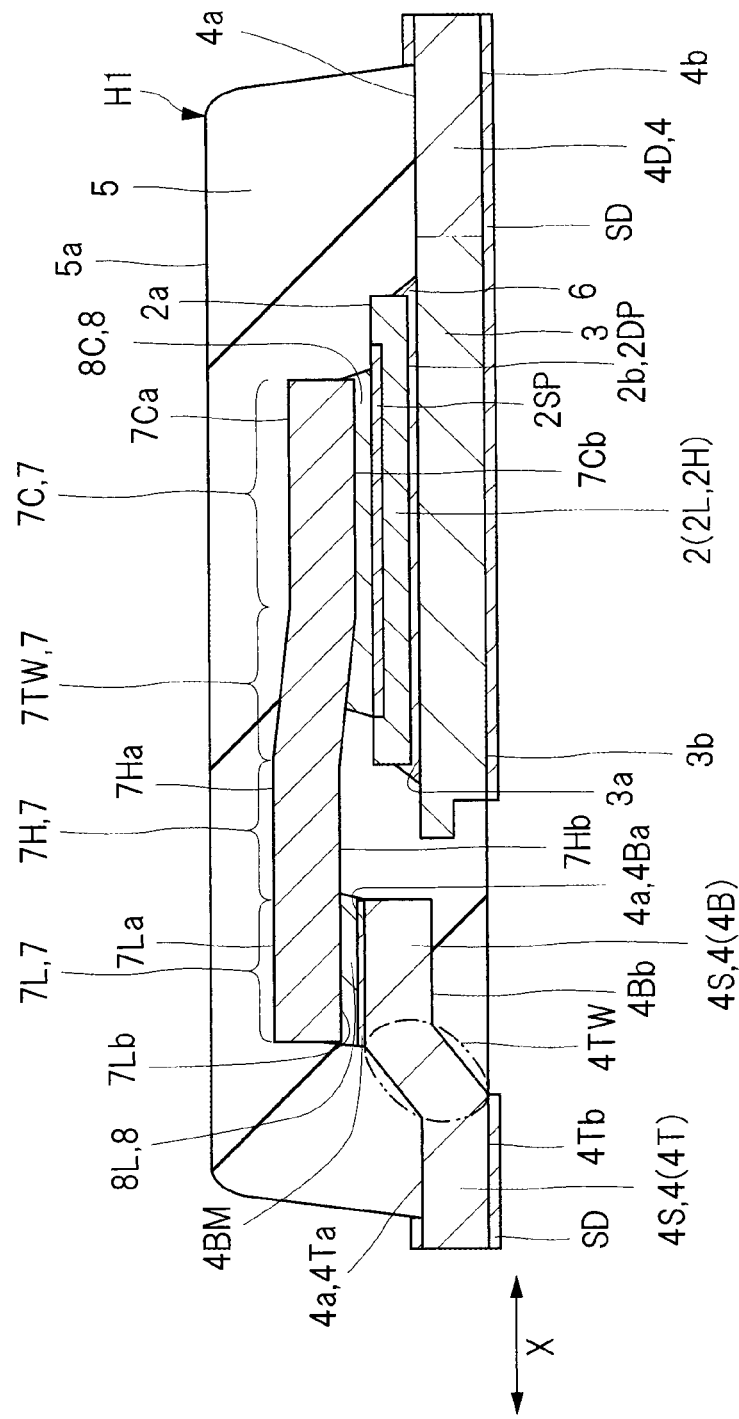
FIG. 30 is a cross-sectional view illustrating a study example different from the semiconductor device illustrated in FIG. 6.

Meanwhile, to dispose the lower surface 7Hb of the intermediate portion 7H at a higher position than the lower surface 7Cb of the chip-connecting portion 7C, other than providing the step portion D1 as illustrated in FIG. 6, there are such conceivable methods and configuring like a semiconductor device H1 as illustrated in FIG. 30. FIG. 30 is a cross-sectional view illustrating another study example than the semiconductor device 1 illustrated in FIG. 6. In the semiconductor device H1 illustrated in FIG. 30 is different from the semiconductor device 1 in the points that a bending portion (inclined portion) 7TW is provided between the intermediate portion 7H and the chip-connecting portion 7C of the metal clip 7 and that the step portion D1 illustrated in FIG. 6 is not provided.

Through the study made by the inventor of the present invention on the configuration like the semiconductor device H1 illustrated in FIG. 30 in which the bending portion 7TW is provided between the intermediate portion 7H and the chip-connecting portion 7C of the metal clip 7, the following problems have been found.

That is, when the bending portion 7TW is provided, a space for disposing the bending portion 7TW is needed. Thus, the area of the intermediate portion 7H is relatively reduced. The 20 intermediate portion 7H has a retained surface 7Ha which is retained by absorption by a retaining jig not illustrated when transferring the metal clip 7 in the manufacturing process of the semiconductor device H1. Thus, when the area of the retained surface 7Ha is reduced, the position alignment accuracy of the metal clip 7 is lowered.

To provide the bending portion 7TW and to ensure a sufficient area for the retained surface 7Ha, it is needed to extend the length of the metal clip 7 (length along the X direction) and thus the planar size of the package is increased.

Particularly, when the thickness of the metal clip 7 is made larger than that of the semiconductor chip 2, for example, to be larger than or equal to about 200 μm, it becomes difficult to form the bending portion 7TW by press work. For example, when the inclined angle of the bending portion 7TW is made steeper, working accuracy is lowered and thus accuracy of the height difference of the lower surface 7Cb of the chip-connecting portion 7C and the lower surface 7Hb of the intermediate portion 7H is lowered. Also, when the bending portion 7TW illustrated in FIG. 30 is formed across the width direction of the metal clip 7 as illustrated in FIG. 5, repulsive force after the bending work is increased and thus work accuracy is lowered. Therefore, when adjusting the height difference of the lower surface 7Cb of the chip-connecting portion 7C and the lower surface 7Hb of the intermediate portion 7H by the bending portion 7TW, it is needed to make the area in a plan view of the bending portion 7TW wider.

Figure 8:
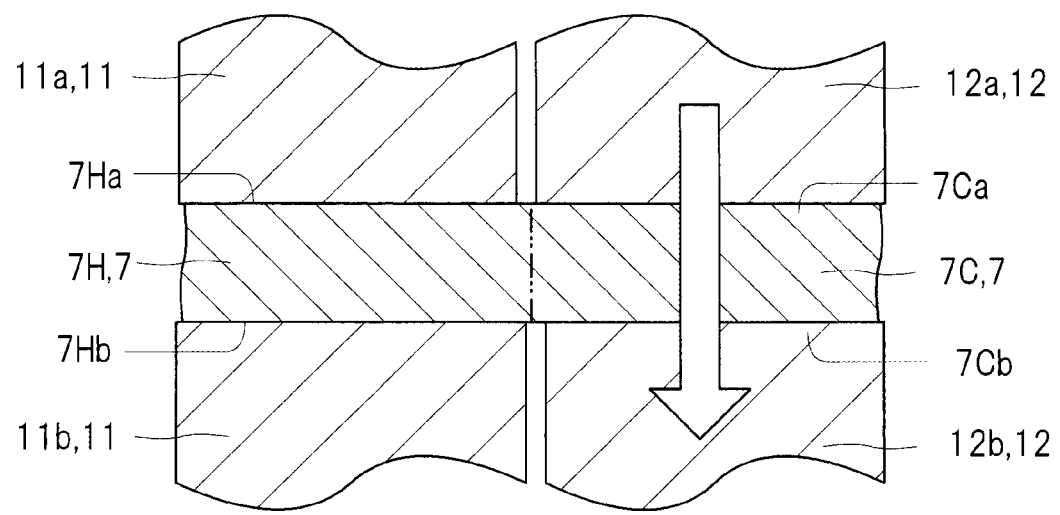
FIG. 8 is an enlarged cross-sectional view illustrating a state immediately before forming a step portion to a metal clip illustrated in FIG. 6.
Figure 9:
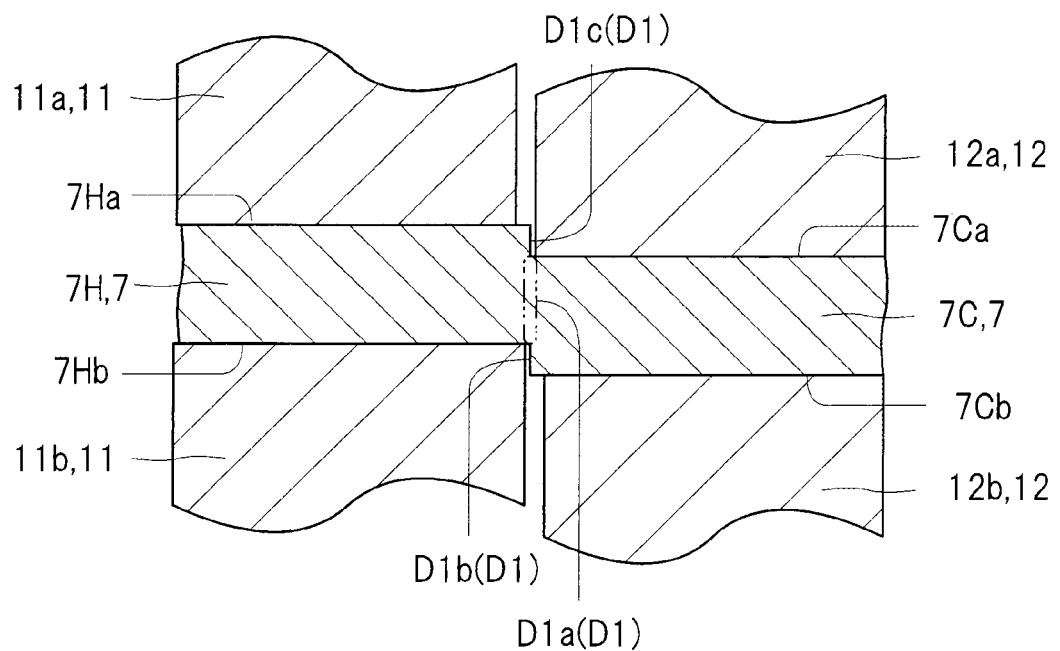
FIG. 9 is an enlarged cross-sectional view illustrating a state in which a step portion is formed by subjecting the metal clip illustrated in FIG. 8 to a press work.

The metal clip 7 included in the semiconductor device 1 illustrated in FIG. 5 adjusts the height difference of the lower surface 7Cb of the chip-connecting portion 7C and the lower surface 7Hb of the intermediate portion 7H. The step portion D1 is formed by, for example, a method illustrated in FIGS. 8 and 9. FIG. 8 is an enlarged cross-sectional view illustrating a state immediately before forming the step portion D1 to the metal clip 7 illustrated in FIG. 6. FIG. 9 is an enlarged cross-sectional view illustrating a state in which the step portion D1 is formed by performing press work on the metal clip 7 illustrated in FIG. 8 in a plan view.

On the other hand, the step portion D1 illustrated in FIG. 6 is formed by performing press work while pressing the intermediate portion 7H and the chip-connecting portion 7C by independent jigs (shearing jigs) 11 and 12, respectively as illustrated in FIGS. 8 and 9.

In more details, as illustrated in FIGS. 8 and 9, the intermediate portion 7H is pressed in-between the jig 11 and the chip-connecting portion 7C is pressed in-between the jig 12. The jig 11 includes an upper jig 11a and a lower jig 11b and fixes the intermediate portion 7H in-between by making the upper jig 11a abut the retained surface 7Ha of the intermediate portion 7H and making the lower jig b abut the lower surface 7Hb of the intermediate portion 7H. The jig 12 includes an upper jig 12a and a lower jig 12b and fixed the chip-connecting portion 7C in-between by making the upper jig 12a abut the upper surface 7Ca of the chip-connecting portion 7C and making the lower jig 12b abut the lower surface 7Cb of the chip-connecting portion 7C.

Also, the jigs 11 and 12 are in a structure independently movable to each other and thus, as schematically illustrated in FIG. 8 denoting by an arrow, the positional relationship of the jigs 11 and 12 can be shifted along the thickness direction of the metal clip 7. As illustrated in FIG. 8, while pressing the intermediate portion 7H and the chip-connecting portion 7C by the jigs 11 and 12, pressing force is applied to the jigs 11 and 12 in the thickness direction of the metal clip 7 (that is, performing press work). Here, at the boundary portion of the intermediate portion 7H and the chip-connecting portion 7C of the metal clip 7, the pressing force is concentrically applied from the jigs 11 and 12, shifting the positional relationship of the intermediate portion 7H and the chip-connecting portion 7C in the thickness direction.

Also, here, at the boundary portion of the intermediate portion 7H and the chip-connecting portion 7C of the metal clip 7, by the pressing force transmitted from the jigs 11 and 12, a part of the boundary portion is deformed by shearing. However, by adjusting a shifting amount of the jigs 11 and 12, the boundary portion of the intermediate portion 7H and the chip-connecting portion 7C is not completely cut off and a part of them can remain in a connected state.

More specifically, when press work is performed, as illustrated in FIG. 9, to the metal clip 7, a joint portion D1a joining the intermediate portion 7H and the chip-connecting portion 7C, a shear surface D1b which goes downward under the joint portion D1a, and a shear surface D1c which goes upward from an upper end of the joint portion D1a are formed in a lump. A method of forming the step portion D1 illustrated in FIGS. 8 and 9 will be described calling it as "shifting work method".

The shear surface D1b is a step surface formed as the lower jig 11b is pushed into the metal clip 7 upwards and a part of the metal clip 7 on the lower surface side is deformed by shearing. The shear surface D1b is connected to the lower surface 7Hb of the intermediate portion 7H and the lower surface 7Cb of the chip-connecting portion having different heights, respectively. Since the shear surface D1b is formed by shear deformation, an angle between the lower surface 7Cb and the lower surface 7Hb can be steep. For example, an angle between the shear surface D1b and the lower surface 7Cb and between the shear surface D1b and the lower surface 7Hb can be 90°, respectively.

The shear surface D1c is a step surface formed as the upper jig 12a is pushed into the metal clip 7 downwards and a part of the metal clip 7 on the upper surface side is deformed by shearing. The shear surface D1c is connected to the upper surface 7Ha of the intermediate portion 7H and the upper surface 7Ca of the chip-connecting portion having different heights, respectively. Since the shear surface D1c is formed by shear deformation, an angle between the upper surface 7Ca and the upper surface 7Ha can be steep. For example, an angle between the shear surface D1c and the upper surface 7Ca and between the shear surface D1a and the upper surface 7Ha can be 90°, respectively.

In this manner, since the step portion D1 is formed by the shifting work method, a space for disposing the step portion D1 in a plan view is almost unnecessary. Thus, also in the case of adjusting the height difference of the lower surface 7Cb of the chip-connecting portion 7C and the lower surface 7Hb of the intermediate portion 7H, reduction of the area for the retained surface 7Ha of the intermediate portion 7H can be prevented or suppressed. Thus, since the retained surface 7Ha can be firmly retained by absorption by a retaining jig not illustrated, the alignment accuracy of the metal clip 7 and the semiconductor chip 2 and the lead 4S can be improved.

Since the shifting work method described above makes the metal clip 7 deformed while sandwiching the metal clip 7 by the jigs 11 and 12, except for the difference in shape of the jigs for deformation, the step portion D1 can be formed by a process same as the process of forming the bending portion 7TW illustrated in FIG. 30. That is, lowering of process efficiency can be suppressed.

In addition, in the shifting work method described above, since apart of the metal clip 7 is deformed by shearing, repulsive force after the shifting work, that is, the force to get back to the original shape of the metal clip 7 after the shifting work is very weak (little). Thus, by controlling the shifting amount of the jigs 11 and 12, the height difference of the lower surface 7Cb of the chip-connecting portion 7C and the lower surface 7Hb of the intermediate portion 7H can be controlled at a good accuracy.

Also, as illustrated in FIG. 6, the metal clip 7 is disposed so that the step portion D1 is positioned on the source electrode pad 2SP of the semiconductor chip 2. In other words, the shear surface D1b is formed toward the source electrode pad 2SP of the front surface 2a of the semiconductor chip 2 from a lower end of the joint portion D1a. At least a part of the shear surface D1b of the step portion D1 is covered by the conductive bonding material 8C. In this manner, by disposing the step portion D1 on the source electrode pad 2SP, the conductive bonding material 8C spreads until the step portion D1 as it runs along the lower surface 7Cb of the chip-connecting portion 7C. But since the boundary of the lower surface 7Cb and the shear surface D1b is an inflection point at which the angle is abruptly changed, it is difficult for the conductive bonding material 8C to spread toward the intermediate portion 7H side from the step portion D1.

More specifically, in view of controlling the level of spreading the conductive bonding material 8C described above, rather than the configuration in which the bending portion 7TW is provided illustrated in FIG. 30, the configuration in which the step portion D1 is provided as illustrated in FIG. 6 is more preferable. Since it is difficult to make the inclined angle of the lower surface of the bending portion 7TW illustrated in FIG. 30 steep as explained above, it becomes easier for the conductive bonding material 8C to spread along the lower surface of the bending portion 7TW. Thus, the amount of disposing the conductive bonding material 8C is needed to be strictly controlled. In addition, also in the case of strictly controlling the amount of disposing the conductive bonding material 8C, depending on the direction in which the conductive bonding material 8C spreads, lowering of connection reliability at a connection point of the metal clip 7 and the source electrode pad 2SP or variations in electrical characteristics may be posed.

On the contrary, when using the metal clip 7 formed by the shifting work method as illustrated in FIG. 6, the spreading direction of the conductive bonding material 8C can be surely controlled by the step portion D1. Thus, electronic characteristics at the connection portion of the metal clip 7 and the source electrode pad 2SP can be stabilized. In addition, electrical connection reliability at the connection portion of the metal clip 7 and the source electrode pad 2SP can be improved.

As described above, since the metal clip 7 will be a conduction path for electrically connecting the source electrode pad 2SP and the lead 4S, it is preferable to make the metal clip 7 thick in view of reducing the resistance components. In the example illustrated in FIG. 6, the thickness of the metal clip 7, that is, each thickness of the chip-connecting portion 7C, the intermediate portion 7H and the lead-connecting portion 7L is larger than that of the semiconductor chip 2 and is, for example, about 200 μm.

Further, when the step portion D1 is formed by the shifting work method, the thickness of the joint portion D1a is smaller than each thickness of the chip-connecting portion 7C, the intermediate portion 7H, and the lead-connecting portion 7L. However, since the chip-connecting portion 7C and the intermediate portion 7H are connected by the joint portion D1a, in view of preventing separation of the chip-connecting portion 7C and the intermediate portion 7H due to breakage of the joint portion D1a, the thickness of the joint portion D1a is preferably larger than the height (thickness) of the shear surface D1b. The height of the shear surface D1b means a distance of the shear surface D1b in the thickness direction of the metal clip 7 and it has the same value as the height difference of the lower surface 7Hb and the lower surface 7Cb.

In other words, the thickness of the metal clip 7 is preferably being twice a necessary amount of the height difference of the lower surface 7Hb and the lower surface 7Cb. For example, in the example illustrated in FIG. 6, since the thickness of the metal clip 7 is 200 pm, the height of the shear surface D1b (height difference of the lower surface 7Hb and the lower surface 7Cb) can be adjusted in a range below 100 μm.

Also, in view of suppressing local lowering of impedance components in the joint portion D1a as a conduction path, especially, the thickness of the joint portion D1a is preferably larger than that of the semiconductor chip 2.

<Method of Manufacturing Semiconductor Device>

Figure 10:
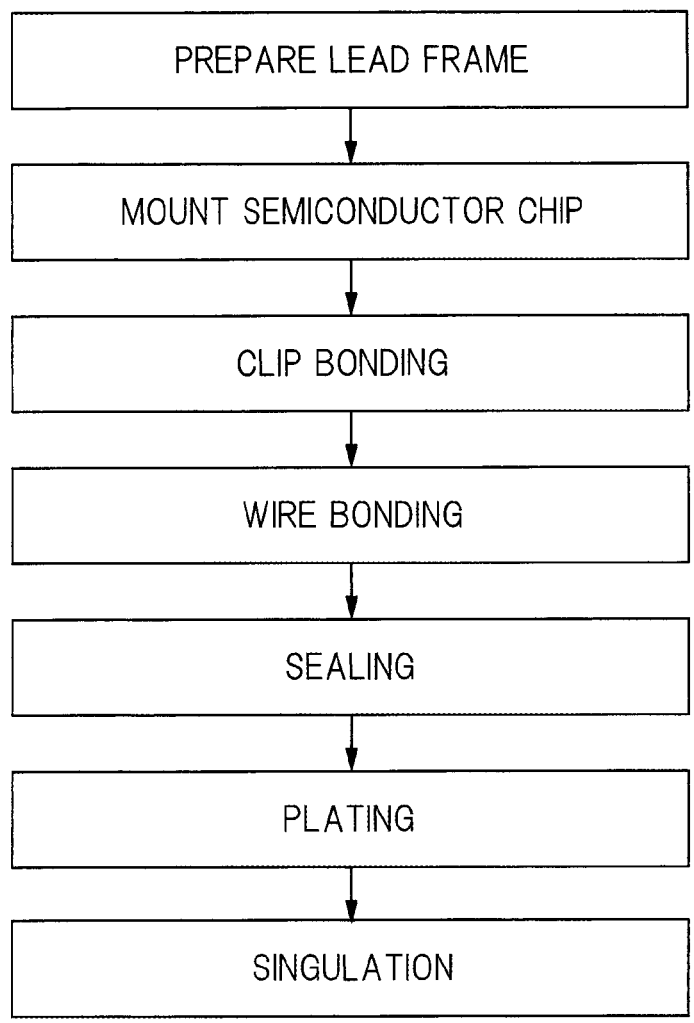
FIG. 10 is an explanatory diagram illustrating a summary of a manufacturing process of the semiconductor device described with reference to FIGS. 1 to 9.

Next, a manufacturing process of the semiconductor device 1 described with reference to FIGS. 1 to 9 will be described. The semiconductor device 1 is manufactured following the flow illustrated in FIG. 10. FIG. 10 is an explanatory diagram illustrating a summary of the method of manufacturing the semiconductor device 1 described with reference to FIGS. 1 to 9. Details of each step of the process will be described with reference to FIGS. 11 to 25.

<Step of Preparing Lead Frame>

Figure 11:
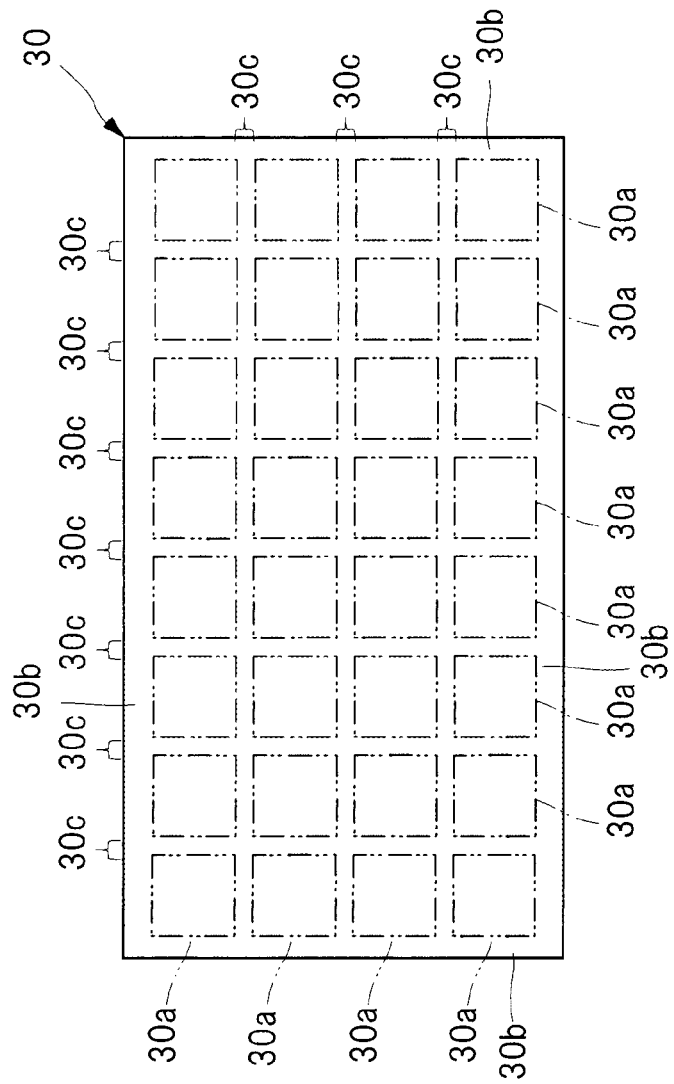
FIG. 11 is a plan view illustrating a whole structure of a lead frame prepared in a lead-frame preparing step illustrated in FIG. 10.
Figure 12:
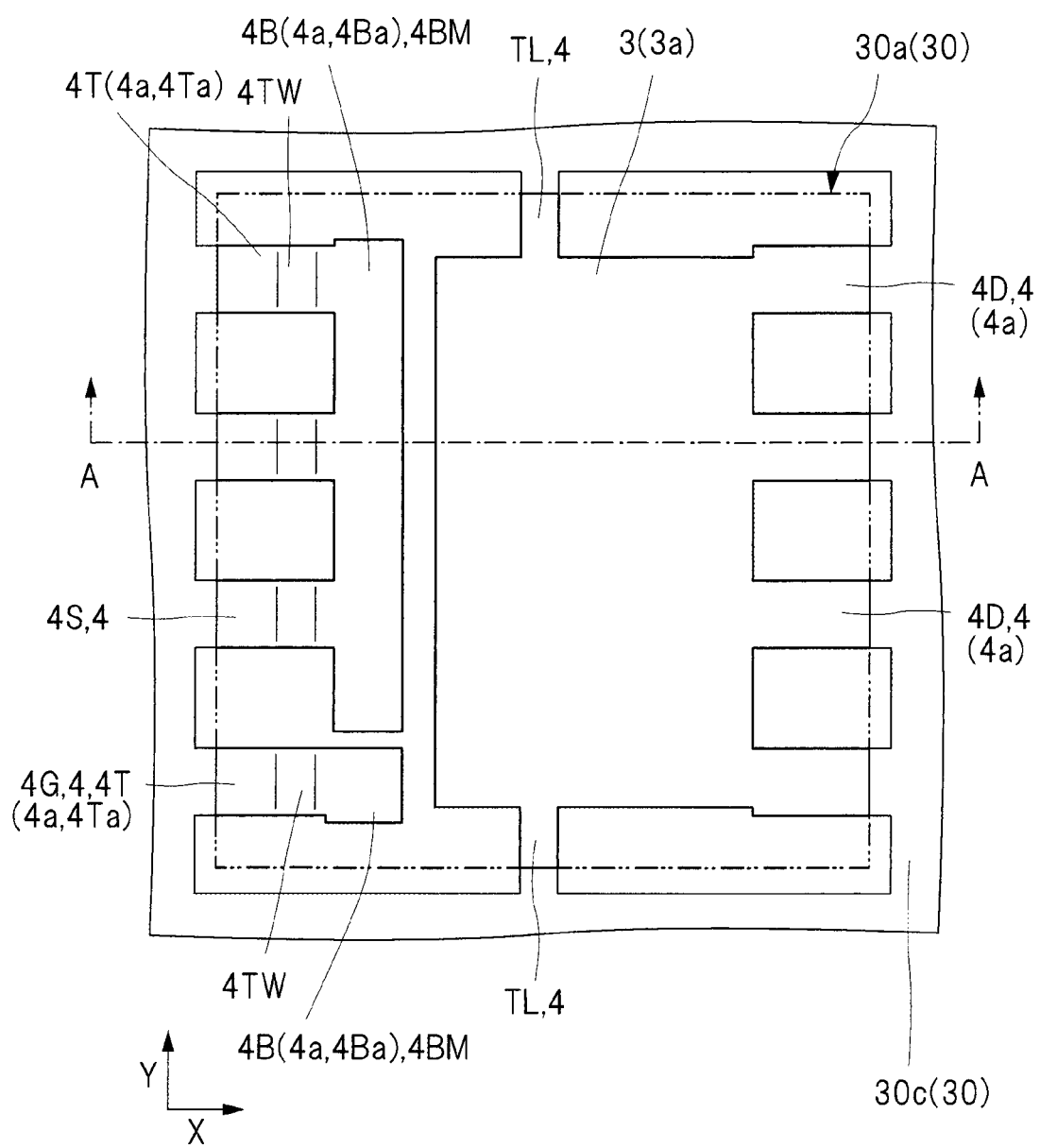
FIG. 12 is an enlarged plan view of one device region illustrated in FIG. 11.
Figure 13:
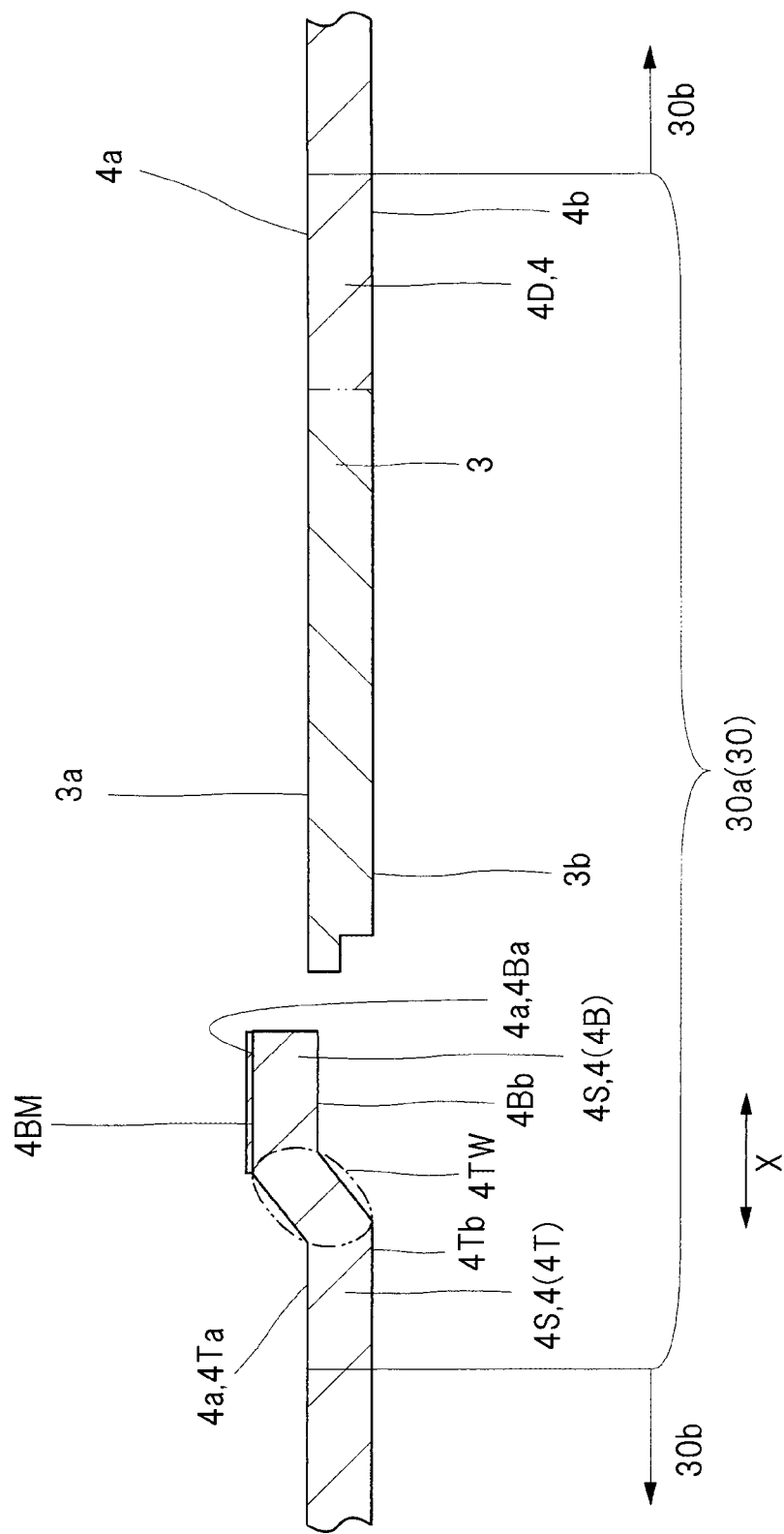
FIG. 13 is an enlarged cross-sectional view taken along an A-A line in FIG. 12.

First, in a step of preparing a lead frame illustrated in FIG. 10, a lead frame 30 illustrated in FIGS. 11 to 13 is prepared. FIG. 11 is a plan view illustrating an entire structure of the lead frame 30 prepared in the step of preparing a lead frame illustrated in FIG. 10. FIG. 12 is an enlarged plan view of one device region illustrated in FIG. 11. FIG. 13 is an enlarged cross-sectional view taken along the line A-A in FIG. 12.

As illustrated in FIG. 11, the lead frame 30 prepared in this step has a plurality of (32 in FIG. 11) device regions 30a inside an outer frame 30b. Each of the plurality of device regions 30a corresponds to one piece of the semiconductor device 1 illustrated in FIG. 5. The lead frame 30 is so-called multi-chip substrate on which the plurality of device regions 30a are disposed in matrix. In this manner, by using the lead frame 30 including the plurality of device regions 30a, a plurality of the semiconductor devices 1 can be manufactured in a lump and thus manufacturing efficiency can be improved. The lead frame 30 is formed of a metal member mainly containing, for example, copper (Cu).

As illustrated in FIG. 12, the circumference of each of the device regions 30a is surrounded by a frame portion 30c. The frame portion 30c is a supporting portion for supporting each member formed inside the device region 30a until a singulating step illustrated in FIG. 10.

As illustrated in FIGS. 12 and 13, to each of the device regions 30a, the tab 3 and the plurality of leads 4 described above with reference to FIGS. 5 and 6 have been already formed. The plurality of tabs 3 are joined to the frame portion 30c disposed around the device region 30a via the suspension leads TL, respectively, and supported by the frame portion 30c.

In the example illustrated in FIG. 12, from one side of the device region 30a forming a square in a plan view toward the opposite side, the plurality of leads 4D, the tab 3 integrally formed with the plurality of leads 4D and the lead 4S are sequentially arranged. The lead 4G is disposed next to the lead 4S.

The bending work has been already performed on the lead 4S and the bending portion 4TW has been already formed. In other words, the connecting surface 4Ba of the connecting portion 4B, which is a metal-plate connecting surface integrally formed with the terminal portion 4T of the lead 4S, is disposed at a higher position than the upper surface 4Ta of the terminal portion 4T. The bending portion 4Tw can be formed by, for example, press work.

Note that, the thickness of the lead frame 30 is, for example, 200 μm to 250 μm and this is thick. Thus, in the lead 4S, the bending portion 4TW is formed at a portion (thin-width portion) having a relatively narrow width (length in Y direction) as compared with the connecting portion 4B. In this manner, when forming the bending portion 4TW at a portion having a thin width, the inclined angle can be steeper than the case of forming the bending portion at a portion having a wider width in the Y direction like, for example, the connecting portion 4B.

As illustrated in FIG. 13, to the connecting surface 4Ba of the lead 4S, the metal film 4BM is previously formed. As illustrated in FIG. 12, to the connecting surface 4Ba of the connecting portion 4B of the lead 4G, the metal film 4BM is previously formed. The metal film 4BM can be formed of, for example, a plating method.

While illustration is omitted, when using a solder material as a die-bonding material in a semiconductor chip mounting step described later, in view of improving wetness of the solder material, it is more preferable to form a metal film (illustration omitted) formed of, for example, nickel (Ni) or silver (Ag) on the upper surface 3a of the tab 3 that is a chip-mounting surface.

Since other features of the lead frame 30 other than those described above are as have been described with reference to FIGS. 5 to 9, repetitive descriptions will be omitted.

<Step of Mounting Semiconductor Chip>

Figure 14:
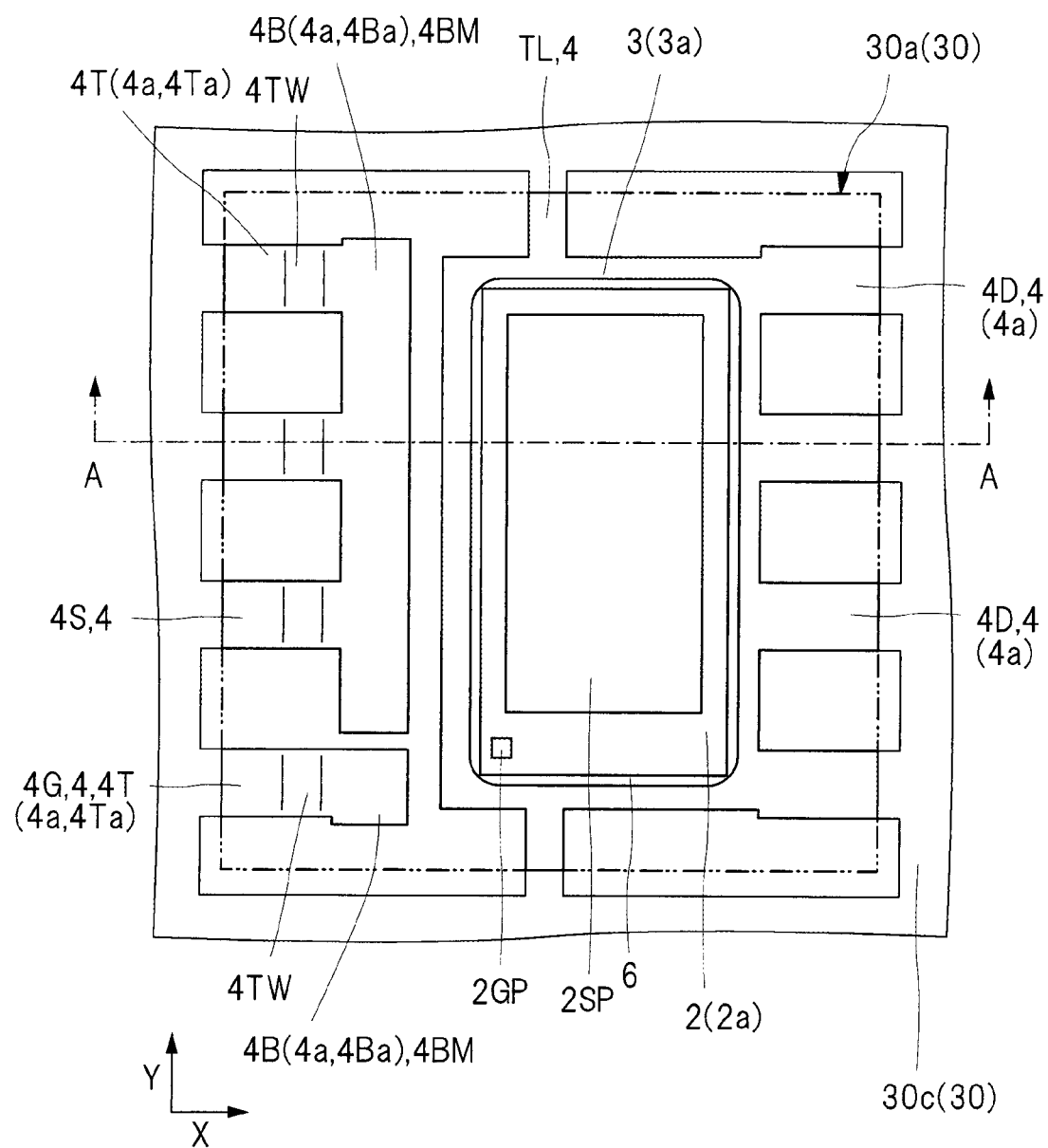
FIG. 14 is an enlarged plan view illustrating a state in which the semiconductor chip is mounted on a chip-mounting portion illustrated in FIG. 12.
Figure 15:
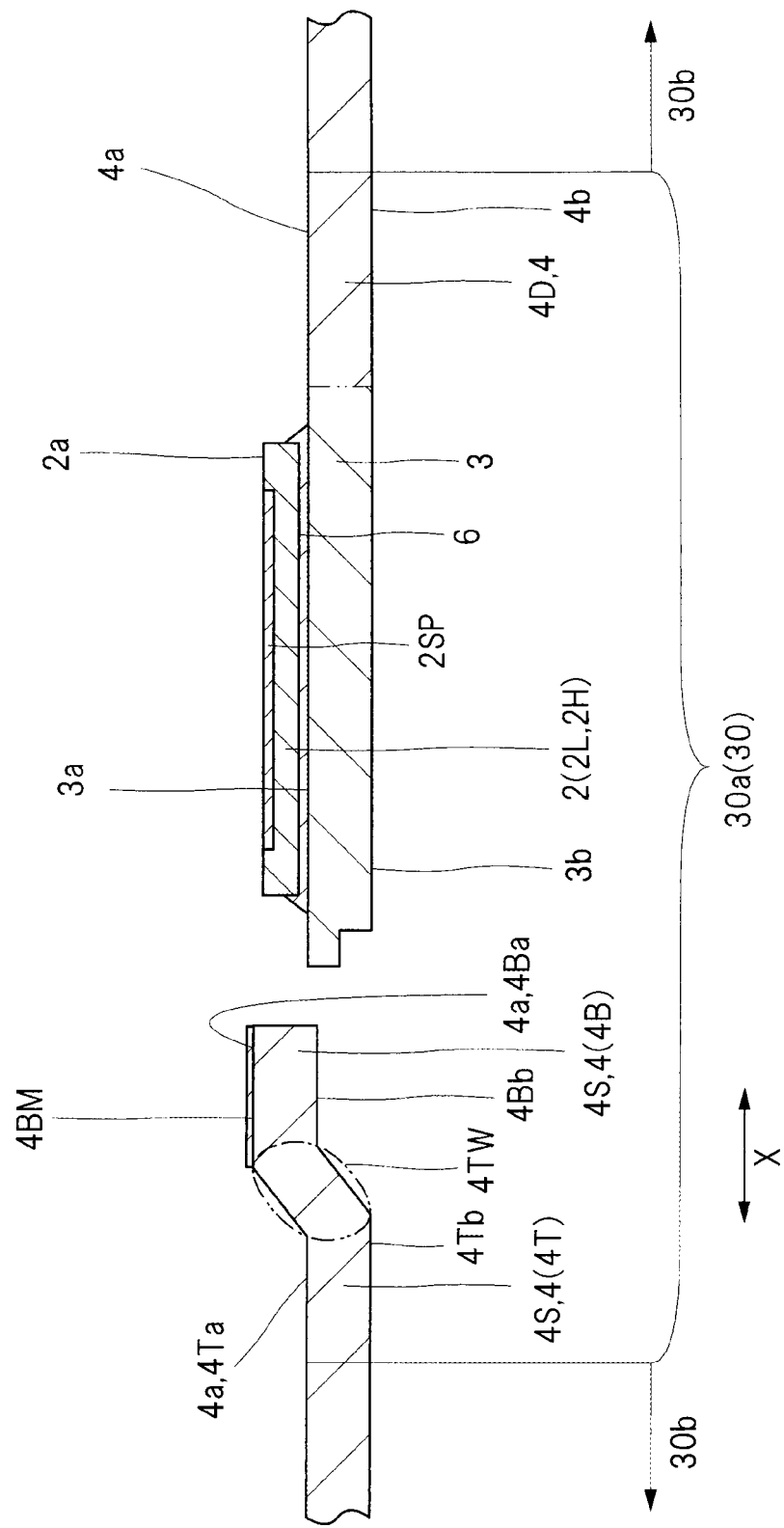
FIG. 15 is an enlarged cross-sectional view taken along an A-A line in FIG. 14.

Next, in a step of mounting a semiconductor chip illustrated in FIG. 10, as illustrated in FIGS. 14 and 15, the semiconductor chip 2 is mounted on the tab 3 of the lead frame 30. FIG. 14 is an enlarged cross-sectional view illustrating a state in which the semiconductor chip 2 is mounted on the chip-mounting portion illustrated in FIG. 12. FIG. 15 is an enlarged cross-sectional view taken along the line A-A in FIG. 14.

In this step, the semiconductor chip 2 is mounted on the tab 3 that is integrally formed with a plurality of the lead 4D. As illustrated in FIG. 15, the semiconductor chip 2 is absorbed or sucked and fixed via the conductive bonding material 6 so that the back surface 2b to which the drain electrode 2DP is formed faces the upper surface 3a that is a chip-mounting surface of the tab 3.

The conductive bonding material 6 is a conductive member (die-bonding material) for fixing the semiconductor chip 2 to the tab 3 and also electrically connecting the semiconductor chip 2 and the tab 3. As the conductive bonding material, for example, a solder material can be used. When using a solder material, for example, a so-called paste solder that is in a paste form in which a flux component for activating solder component can be used. Alternatively, a wire solder which is harder (rigid) than the paste solder and formed in a band-like shape formed like a ribbon solder or a line-shape can be used. When using a solder material, in any cases of the paste solder, ribbon solder, and wire solder, a heating process (reflow process) for melting a solder component and bonding the solder material to a bonding subject is needed.

As a modification example of the conductive bonding material 6, a conductive adhesive material in which a plurality of conductive particles (for example, silver particles) are mixed in a resin material that contains a thermosetting resin such as epoxy resin can be used. When using the conductive adhesive material, by performing a heating processing (curing processing) for curing the thermosetting resin component, the conductive bonding material 6 is absorbed or sucked and fixed to the bonding subject. This curing processing is performed at a lower heating temperature as compared with the reflow processing described and thus has an advantage in reducing temperature of an assembly process. In addition, after once the conductive adhesive material is cured, the conductive adhesive material is hardly remelted. Thus, freedom in selection of a bonding material (for example, solder material) used upon mounting a completed product is improved.

However, when using a conductive adhesive material, a conductive path is ensured by putting a large number of conductive particles in close contact and thus a solder member is preferable in view of electrical connection reliability.

Also, since the structure of the semiconductor chip 2 has been already described above with reference to FIGS. 1 and 2, repetitive descriptions will be omitted.

<Step of Clip-Bonding>

Figure 16:
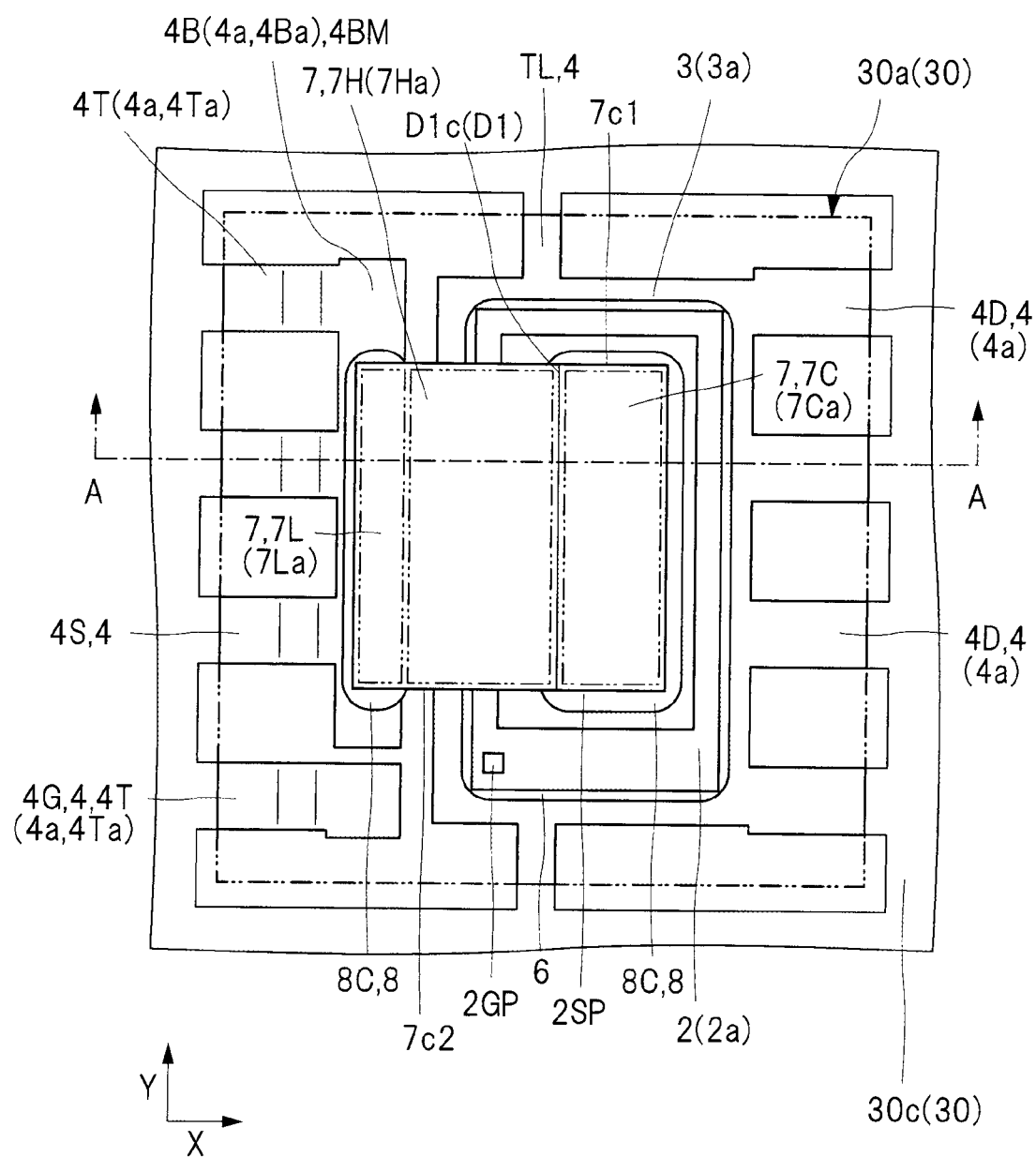
FIG. 16 is an enlarged plan view illustrating a state in which the semiconductor chip and the lead illustrated in FIG. 14 are electrically connected via the metal clip.
Figure 17:
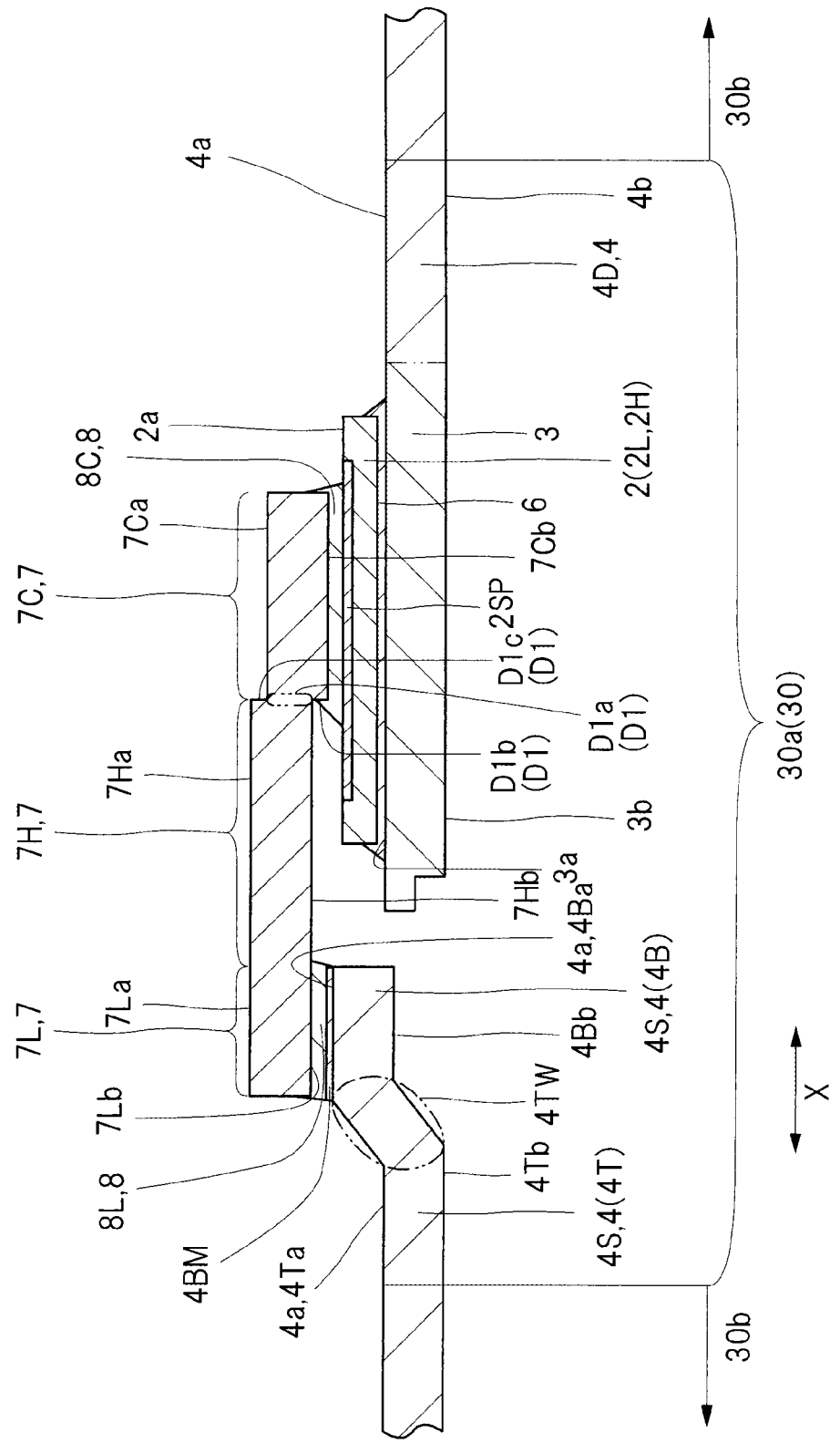
FIG. 17 is an enlarged cross-sectional view taken along a line A-A in FIG. 16.
Figure 18:
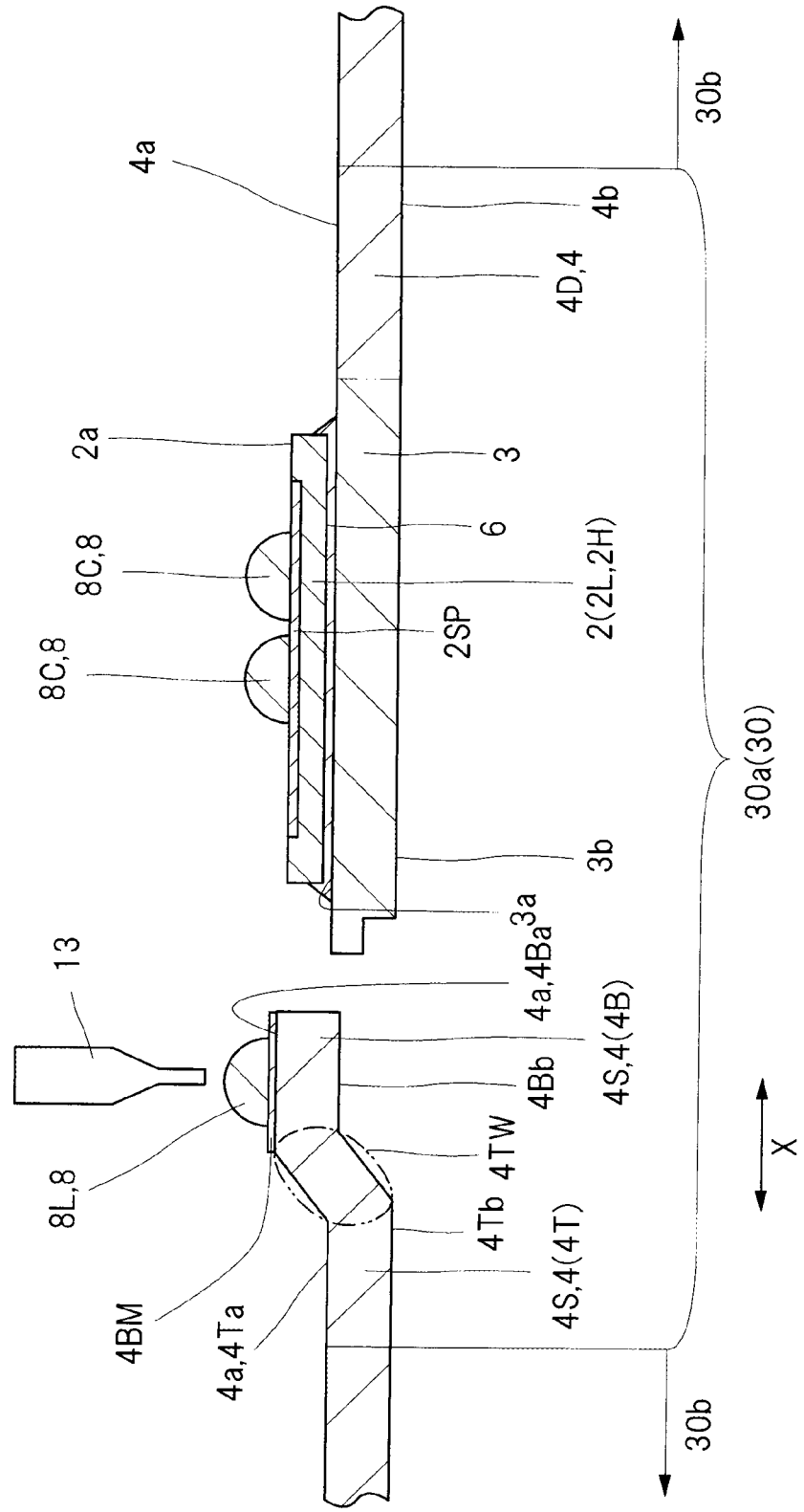
FIG. 18 is an enlarged cross-sectional view illustrating a state in which a clip-bonding material is disposed on regions for connecting the metal clip illustrated in FIG. 17.
Figure 19:
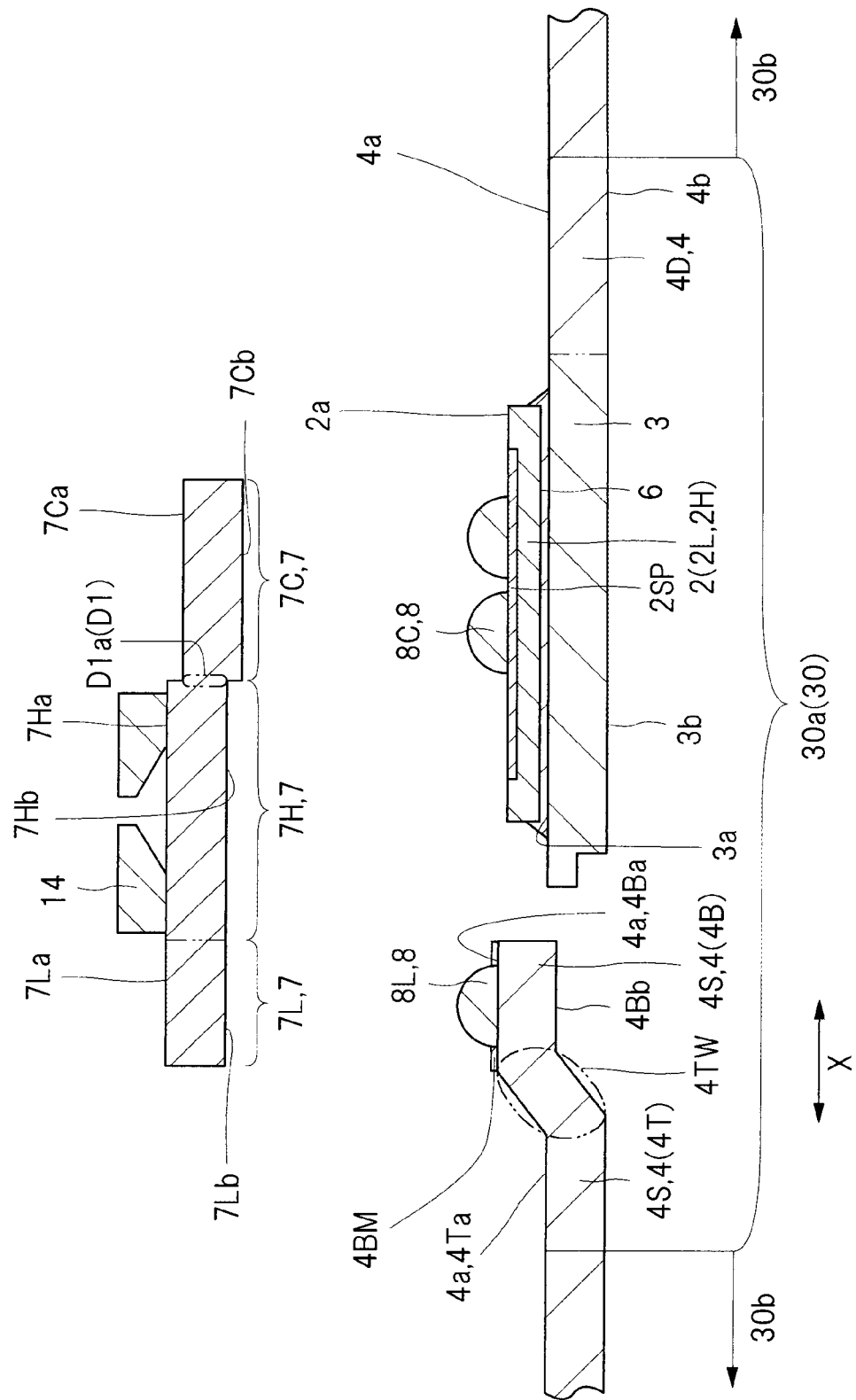
FIG. 19 is an enlarged cross-sectional view illustrating a state in which a metal clip is disposed on the semiconductor chip.
Figure 20:
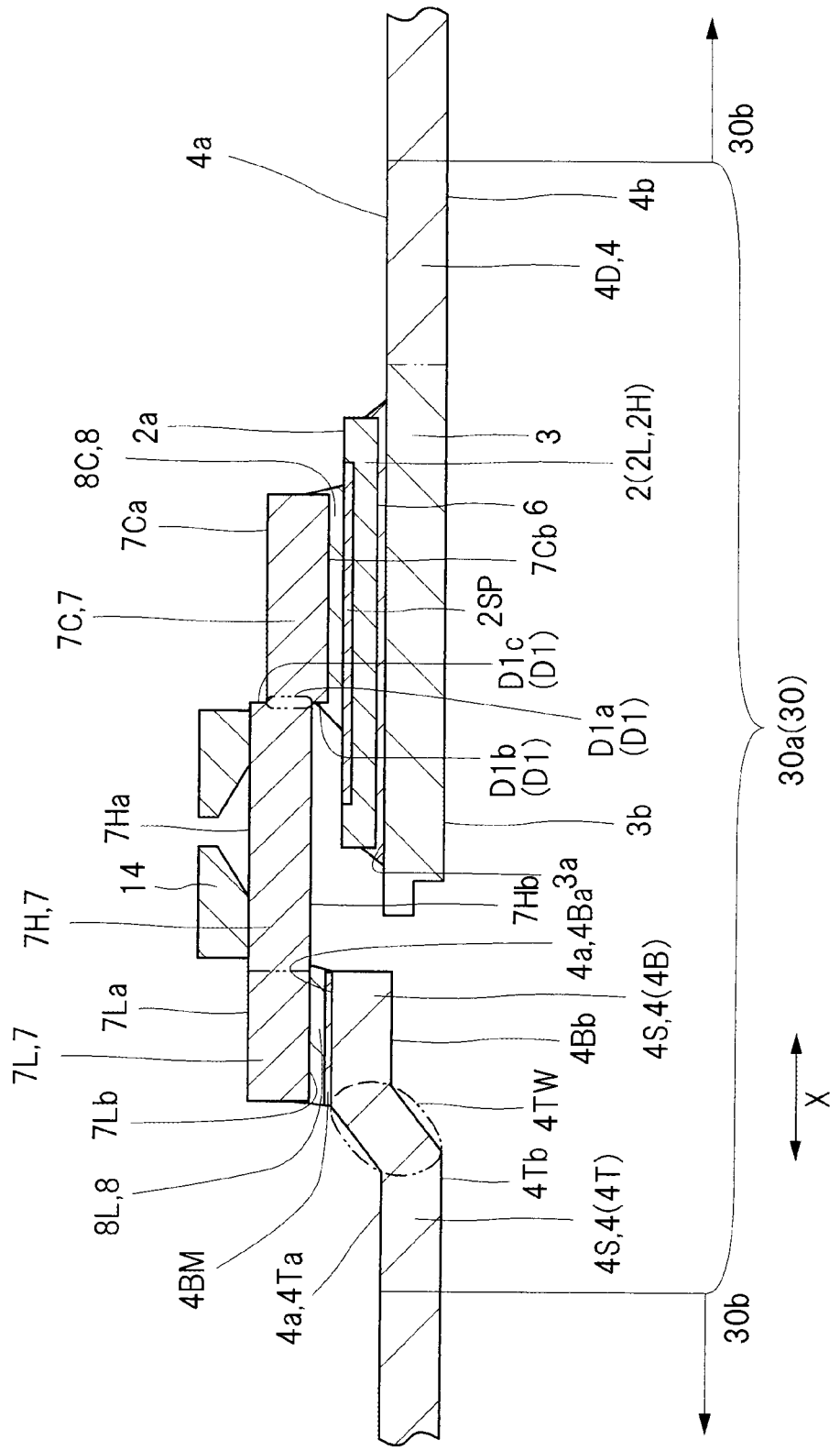
FIG. 20 is an enlarged cross-sectional view illustrating a state in which the metal clip is being pressed on to the lead frame.

Next, in a clip-bonding step illustrated in FIG. 10, as illustrated in FIGS. 16 and 17, the source electrode pad 2SP of the semiconductor chip 2 and the connecting surface 4Ba of the connecting portion 4B of the lead 4S are electrically connected via the metal clip 7. FIG. 16 is an enlarged plan view illustrating a state in which the semiconductor chip 2 and the lead illustrated in FIG. 14 are electrically connected via metal clip 7. FIG. 17 is an enlarged cross-sectional view taken along the line A-A in FIG. 16. FIGS. 18 to 20 are enlarged cross-sectional views sequentially illustrating steps of bonding the metal clip 7 illustrated in FIG. 17.

In this step, by the method described with reference to FIGS. 8 and 9, the step portion D1 is previously formed to the metal clip 7. Although illustration is omitted, when a metal clip frame to which the plurality of metal clips 7 are fixed inside the frame is prepared and press work is performed in a lump to the plurality of metal clips 7, manufacturing efficiency of the metal clips 7 can be improved.

In this step, first, as illustrated in FIG. 18, on the connecting surface 4Ba of the lead 4S that is a region for connecting the metal clip 7 (see FIG. 17) and on the source electrode pad 2SP of the semiconductor chip 2, the conductive bonding materials 8L and 8C which are clip-bonding materials (metal-plate bonding material) are disposed, respectively. In FIG. 18, an example of disposing the conductive bonding materials 8L and 8C which are paste-like solder materials by discharging them from a supplying apparatus (syringe) 13 is illustrated.

Next, as illustrated in FIG. 19, the metal clip 7 to which the step portion D1 has been already formed and singulated is transferred onto the lead 4S and the semiconductor chip 2. Here, the metal clip 7 is transferred by a transferring jig in a state in which the retained surface 7Ha of the intermediate portion 7H is absorbed (or sucked) and retained by a collet 14 that is a retaining jig for absorbing (or sucking) and retaining the metal clip 7. Here, the lower surface 7Lb of the lead-connecting portion 7L faces the conductive bonding material 8L on the lead 4S, and the lower surface 7Lb of the chip-connecting portion 7C faces the conductive bonding material 8C. In addition, the step portion D1 of the metal clip 7 is positioned above the source electrode pad 2SP.

As described above, according to the present embodiment, since space for disposing the step portion D1 is almost not needed, a sufficient area for the retained surface 7Ha of the intermediate portion 7H disposed between the chip-connecting portion 7C and the lead-connecting portion 7L can be ensured. Thus, in this step, since the metal clip 7 is firmly absorbed or sucked and retained, alignment of the metal clip 7 can be performed at a high accuracy.

Next, as illustrated in FIG. 20, the metal clip 7 is pressed toward the lead frame 30. Here, when using a paste-like solder material or a conductive adhesive material (for example, silver paste) as the conductive bonding materials 8L and 8C, the conductive bonding material 8L is pushed and spread as being sandwiched between the lead-connecting portion 7L of the metal clip 7 and the connecting portion 4B of the lead 4S. Also, the conductive bonding material 8C is pushed and spread as being sandwiched between the chip-connecting portion 7C of the metal clip 7 and the source electrode pad 2SP of the semiconductor chip 2. Note that, although an example in which the conductive bonding materials are pressed by the collet 14 in FIG. 20, the member for pressing the metal clip 7 can be another jig than the collet 14 (for example, press-dedicated jig or heating jig) can be used.

Next, by heating the conductive bonding materials 8L and 8C, the metal clip 7 and the lead 4S are fixed and the metal clip 7 and the source electrode pad 2SP are fixed in a state in which the metal clip 7 and the lead 4S are electrically connected and the metal clip 7 and the source electrode pad 2SP are electrically connected. When using a solder material as the conductive bonding materials 8L and 8C, as the reflow step, the lead frame 30 on which the metal clip 7 is mounted is heated at a temperature higher than a melting point of the solder material. In this manner, the conductive bonding materials 8L and 8C are melted and bonded to the metal clip 7, the source electrode pad 2SP, and the connecting portion 4B of the lead 4S, respectively. Here, the melted solder material is shaped by the surface tension of the solder material itself. Thus, as illustrated in FIG. 20, when the shear surface D1b of the step portion D1 is provided at the boundary of the chip-connecting portion 7C and the intermediate portion 7H, at the circumference portion of the conductive bonding material 8C, a filet covering a part of the shear surface D1b is formed and thus it becomes difficult for the solder material to spread toward the intermediate portion 7H side.

In addition, when using a solder material as the conductive bonding materials 8L and 8C, after the reflow step, the solder material is cooled. In this manner, the conductive bonding material 8L and 8C are cured so that the metal clip 7 and the lead 4S are fixed and the metal clip 7 and the source electrode pad 2SP are fixed in a state that the metal clip 7 and the lead 4S are electrically connected and the metal clip 7 and the source electrode pad 2SP are electrically connected. Here, when a fillet in which the conductive bonding material 8C covering the side surfaces 7c1 and 7c2 of the metal clip 7 is formed as illustrated in FIG. 16, since the conductive bonding material 8C is in close contact so as to enwrap the chip-connecting portion 7C of the metal clip 7, bonding strength of the metal clip 7 can be improved. Further, forming a fillet covering the shear surface D1b illustrated in FIG. 20 can also improve the bonding strength of the metal clip 7.

Note that, when using a flux that is an activating component for easing bonding of the conductive bonding materials 8L and 8C, after the conductive bonding materials 8L and 8C are cured, cleaning is performed to remove residue of the flux.

On the other hand, when using a conductive adhesive material such as silver paste is used as the conductive bonding materials 8L and 8C, as a curing sep, a thermosetting resin component contained in the conductive bonding materials 8L and 8C are cured. In this manner, the metal clip 7 and the lead 4S are fixed and the metal clip 7 and the source electrode pad 2SP are fixed in a state in which the metal clip 7 and the lead 4S are electrically connected and the metal clip 7 and the source electrode pad 2SP are electrically connected. Generally, temperature at which a thermosetting resin is cured is lower than a melting point of a solder material. Thus, in the curing step, the conductive bonding materials 8L and 8C can be cured at a lower temperature than the reflow step.

In addition, when forming a fillet in which the conductive bonding material 8C covers the side surfaces 7c1 and 7c2 of the metal clip 7 as illustrated in FIG. 16, since the conductive bonding material 8C is in close contact so as to enwrap the chip-connecting portion 7C of the metal clip 7, the capability of improving the bonding strength of the metal clip 7 is the same also in the case of using a conductive adhesive material. Further, forming a fillet covering the shearing surface D1b can also improve the bonding strength of the metal clip 7.

According to the steps described above, as illustrated in FIGS. 16 and 17, the source electrode pad 2SP of the semiconductor chip 2 and the connecting surface 4Ba of the connecting portion 4B of the lead 4S are electrically connected via the metal clip 7.

According to the present embodiment, as illustrated in FIG. 16, the conductive bonding material 8C is exposed at the side surfaces 7c1 and 7c2 of the metal clip 7. Thus, it is preferable to inspect the bonding portion of the metal clip 7 and the source electrode pad 2SP. In this case, a visual inspection or camera inspection of the bonding portion of the metal clip 7 and the source electrode pad 2SP is sufficient.

<Step of Wire-Bonding>

Figure 21:
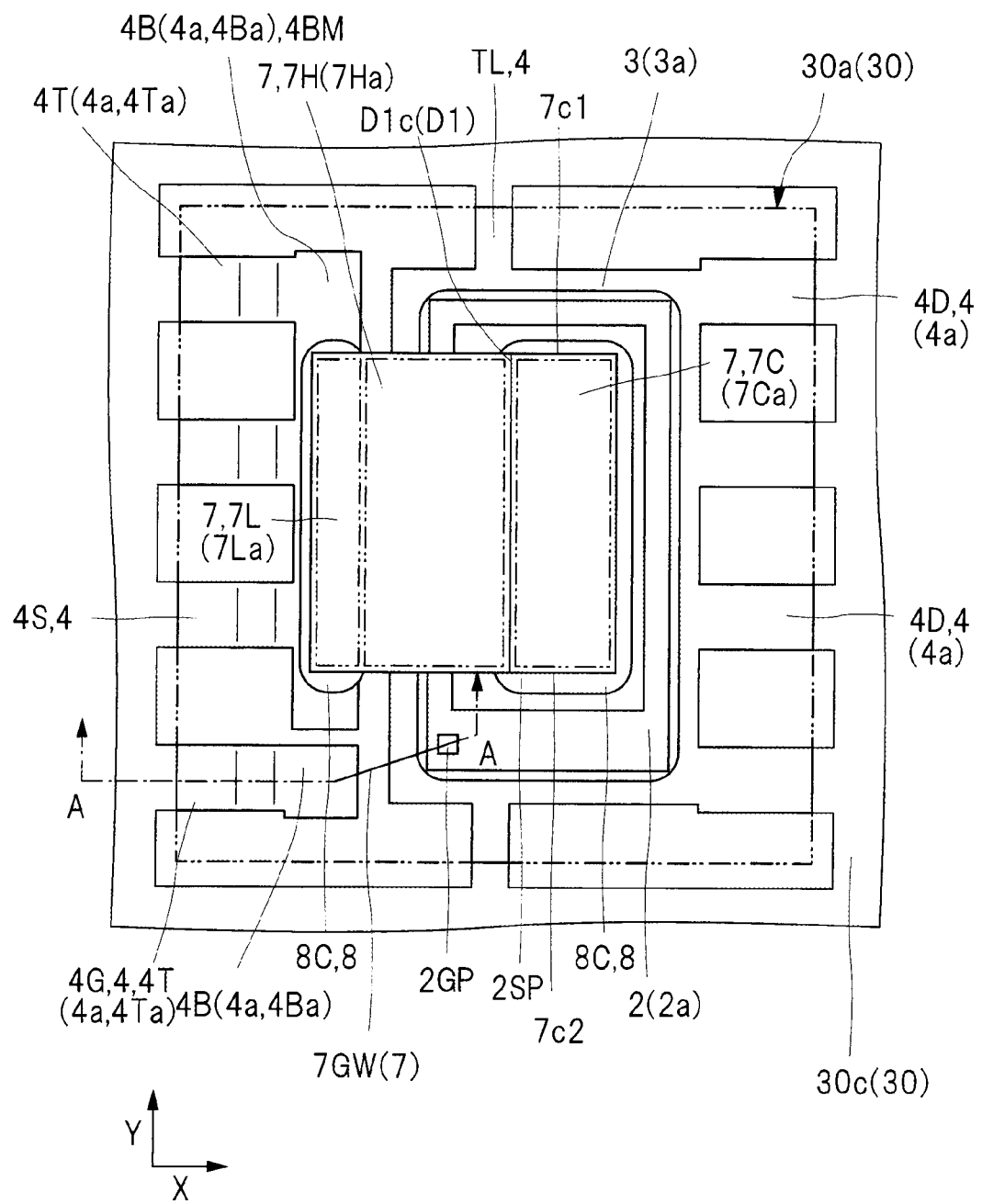
FIG. 21 is an enlarged plan view illustrating a state in which the semiconductor chip and the lead are electrically connected via a wire.
Figure 22:
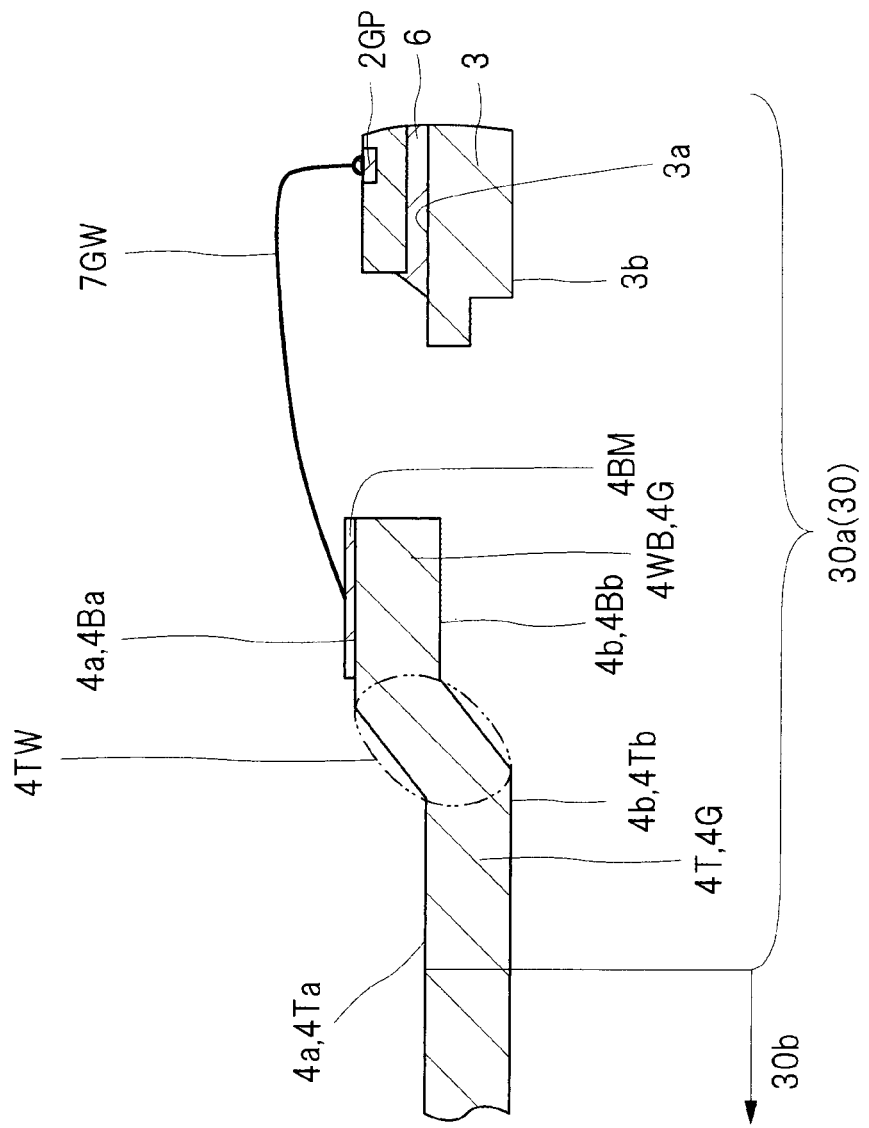
FIG. 22 is an enlarged cross-sectional view taken along a line A-A in FIG. 21.

In addition, in a wire-bonding step illustrated in FIG. 10, as illustrated in FIGS. 21 and 22, the gate electrode pad 2GP of the semiconductor chip 2 and the connecting surface 4Ba of the connecting portion 4B of the lead 4G are electrically connected via the wire (metal wire) 7GW.

FIG. 21 is an enlarged plan view illustrating a state in which the semiconductor chip 2 and the lead are electrically connected to via a wire illustrated in FIG. 16. FIG. 22 is an enlarged cross-sectional view taken along the line A-A in FIG. 21.

As illustrated in FIG. 22, in this step, for example, the lead frame 30 in which the semiconductor chip 2 is mounted on the tab 3 in each device region 30a is disposed on a heat stage (lead-frame heating table) not illustrated. Then, the gate electrode pad 2GP of the semiconductor chip 2 and the lead 4G are electrically connected to via the wire 7G. In the present embodiment, the wire 7GW is supplied by using, for example, a capillary not illustrated, and the wire 7GW is bonded by a so-called nail-head bonding method using both ultrasonic waves and thermal pressure bonding.

For example, in the example illustrated in FIGS. 21 and 22, first, one end of the wire 7GW formed of, for example, gold (Au) is bonded to a metal film (for example, aluminum film or gold film) formed to the uppermost surface of the gate electrode pad 2GP. In addition, the other end of the wire 7GW is bonded on the metal film 4BM on the lead 4G to electrically connect the gate electrode pad 2GP and the lead 4G are electrically connected. Next, as an excessive part of the wire is cut off, the wire 7GW illustrated in FIGS. 21 and 22 is formed.

Note that, although performing the wire-bonding step after the clip-bonding step is illustrated in FIG. 10, as a modification example, the clip-bonding step can be performed after performing 25 the wire-bonding step.

<Step of Sealing>

Figure 23:
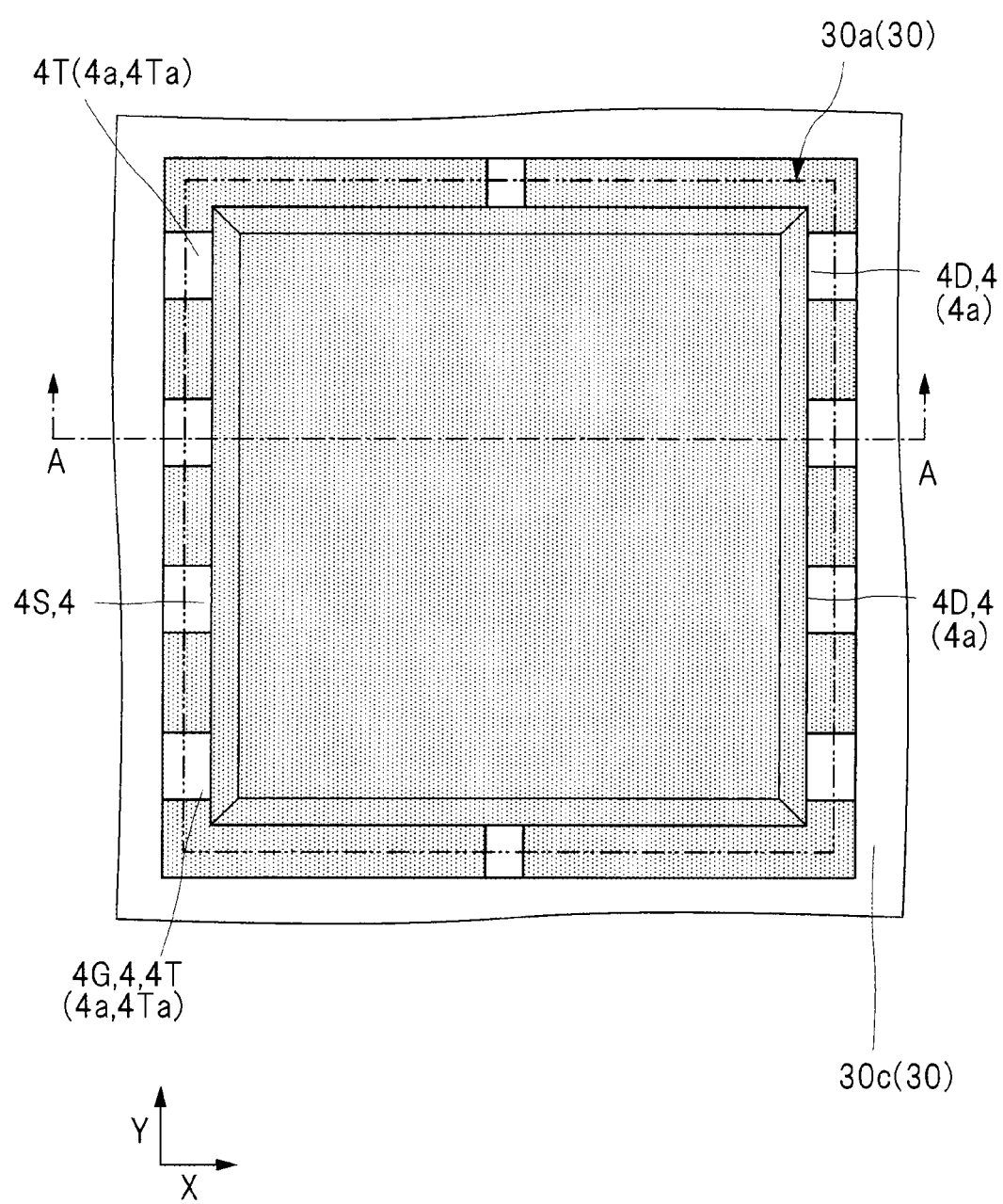
FIG. 23 is an enlarged plan view illustrating a state in which a sealant for sealing the semiconductor chip and the metal clip is formed.
Figure 24:
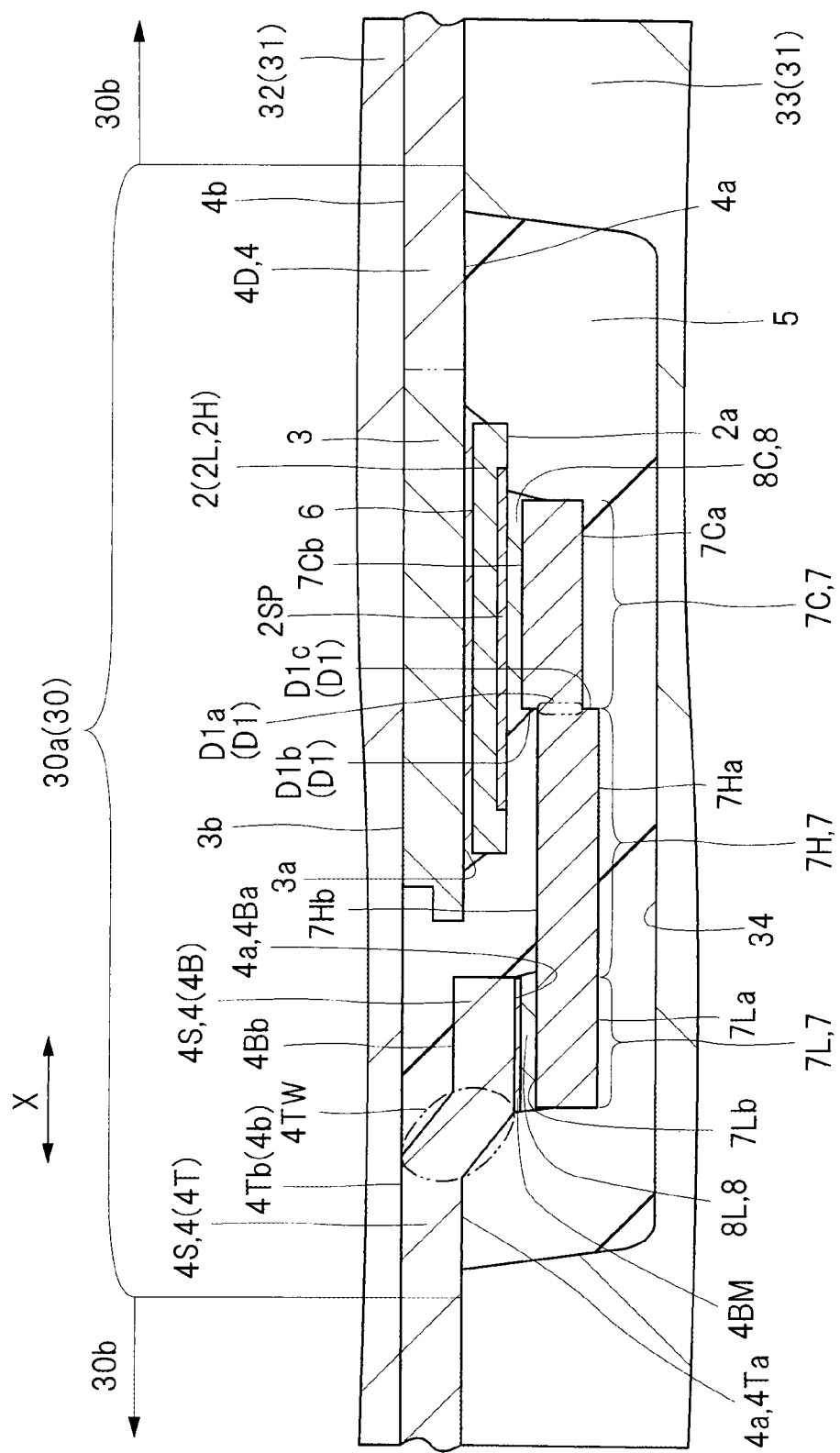
FIG. 24 is an enlarged cross-sectional view illustrating a state in which a lead frame is disposed inside a mold taken along a line A-A in FIG. 23.

Next, in a sealing step illustrated in FIG. 10, as illustrated in FIG. 24, the semiconductor chip 2, the upper surface 3a of the tab 3, the connecting portion 4B of the lead 4S, and the metal clip 7 are sealed by an insulating resin and the sealant 5 is formed. FIG. 23 is an enlarged plan view illustrating a state in which the sealant 5 for sealing the semiconductor chip 2 and the metal clip 7 is formed illustrated in FIG. 21. FIG. 24 is an enlarged cross-sectional view illustrating a state in which the lead frame 30 is disposed in a mold in an enlarged cross-sectional view taken along the line A-A in FIG. 23.

In this step, for example, by using a mold 31 including an upper mold (first mold) 32 and a lower mold (second mold) 33 as illustrated in FIG. 24, the sealant 5 is formed by a so-called transfer mold method.

In the example illustrated in FIG. 24, the lead frame 30 is disposed so that the device region 30a is positioned in the cavity 34 formed to the lower mold 33 and the lead frame 30 is clamped (sandwiched) between upper mold 32 and the lower mold 33. In this state, when the softened (flexibilized) thermosetting resin (insulating resin) is pressed to be inserted to the cavity 34 of the mold 31, the insulating resin is supplied into a space formed by the cavity 34 and the upper mold 32 and molded along with the shape of the cavity 34.

Here, when the lower surface 3b of the tab 3 and the lower surface 4b of the plurality of leads 4 are in close contact with the upper mold 32, respectively, the lower surfaces 3b and 4b are exposed from the sealant 5 at the lower surface 5b of the sealant 5. On the other hand, the lower surface 4b of the connecting portion 4B of the lead 4 is not in close contact with the lower mold 33. Thus, the connecting portion 43 is covered with the insulating resin and sealed by the sealant 5. In addition, although illustration is omitted, also regarding the lead 4G described with reference to FIGS. 21 and 22, each lower surface 4Tb of the terminal portion 4T is exposed from the sealant 5 illustrated in FIG. 23 and the connecting portion 4B is sealed by the sealant 5. In this manner, as a part of the leads 4 is sealed by the sealant 5, it is difficult for the leads 4 to fall off from the sealant 5.

Note that, in FIG. 24, a so-called single-piece molding method in which one device region 30a is embedded in one cavity 34 has been described. However, as modification example, for example, a method of sealing the plurality of device regions 30a it a lump by a mold having the cavity 34 covering the plurality of device regions 30 at once as illustrated in FIG. 11 can be used. Such a sealing method is called "block molding" method or "mold array process" method and they makes an efficient area in one lead frame 30 large.

Although the sealant 5 is formed with an insulating resin as a main component, for example, by mixing filler particles such as silica (silicon dioxide: SiO2) particles in the thermosetting resin, functions of the sealant 5 (for example, resistance to warping deformation) can be improved.

<Step of Plating>

Figure 25:
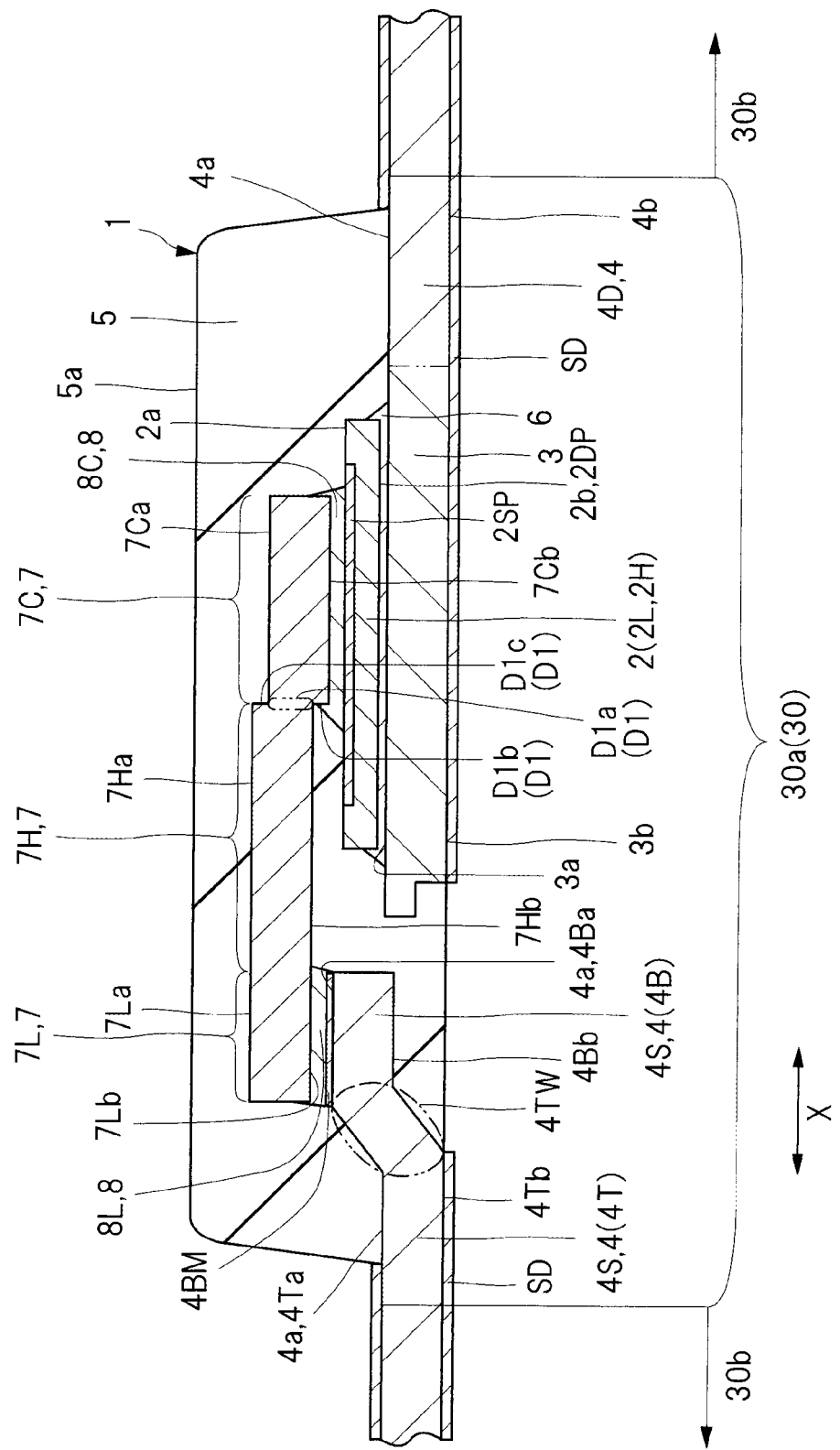
FIG. 25 is an enlarged cross-sectional view illustrating a state in which a metal film is formed to a surface of a tab and the lead illustrated in FIG. 24 exposed from the sealant.

Next, in a plating step illustrated in FIG. 10, as illustrated in FIG. 25, the lead frame 30 is dipped in a plating solution not illustrated to form the metal film SD on a surface of the metal part of the lead frame 30 exposed from the sealant 5. FIG. 25 is an enlarged cross-sectional view illustrating a state in which the metal film SD is formed to the surface of the tab and the lead exposed from the sealant 5 illustrated in FIG. 24.

In the example illustrated in FIG. 25, for example, the lead frame 30 is dipped in a solder solution to form the metal film SD that is a solder film by an electroplating method. The metal film SD has a function of improving wetness of the bonding material upon mounting the completed semiconductor device 1 (see FIG. 6) onto a mounting board not illustrated. Types of the solder film include, for example, tin-lead plating, pure-tin plating that is Pb-free plating, tin-bismuth plating, etc.

Note that, a previously-plated lead frame on which a conductive film is previously formed to a lead frame can be used. The conductive film here is often formed of a nickel film, a palladium film formed on the nickel film, and a gold film formed on the palladium film. When using the previously-plated lead frame is used, this plating step is omitted.

<Step of Singulation>

Figure 26:
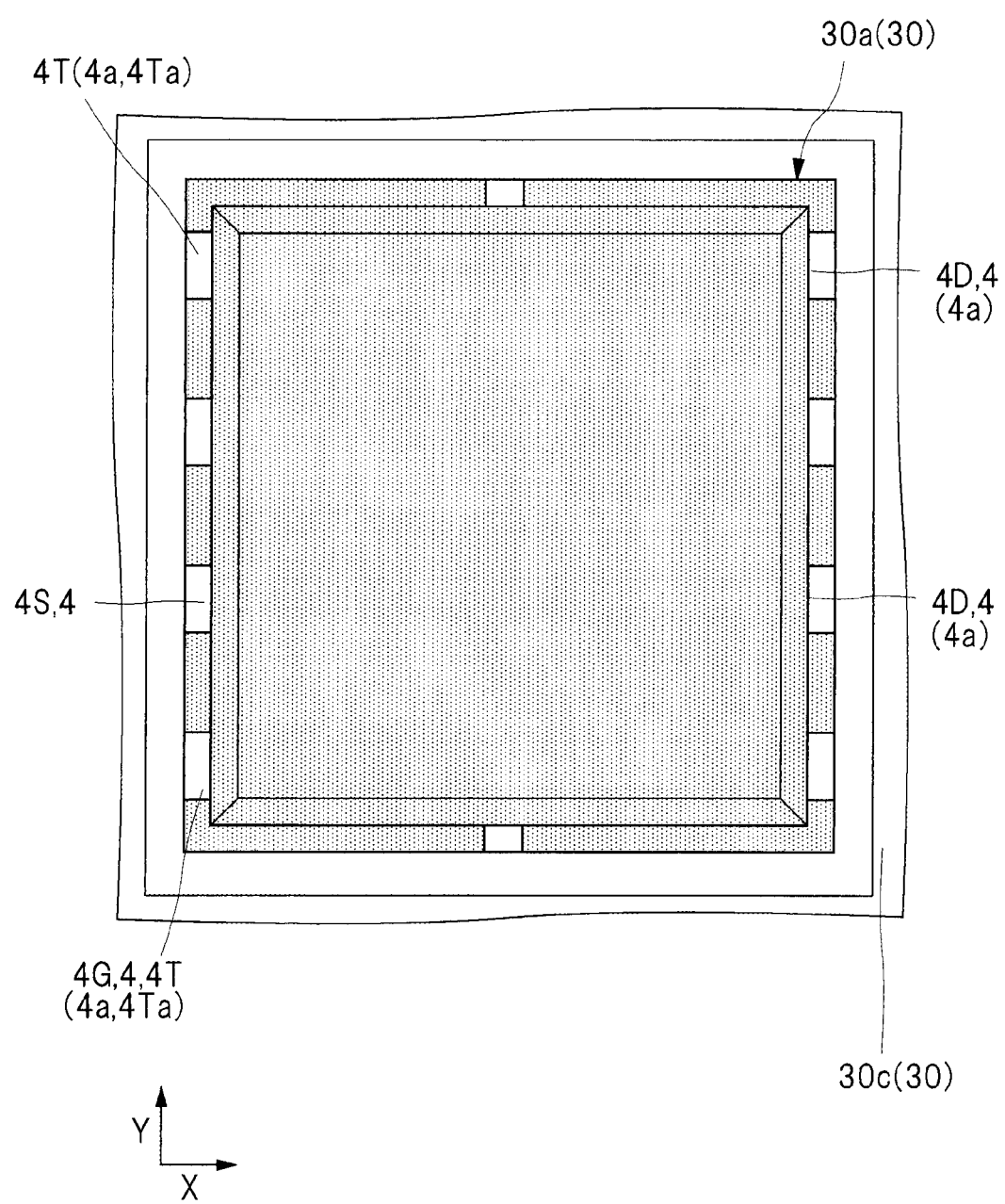
FIG. 26 is an enlarged plan view illustrating a state in which the lead frame illustrated in FIG. 23 is singulated.

Next, in a singulating step illustrated in FIG. 10, as illustrated in FIG. 26, the lead frame 30 is divided per the device region 30a. FIG. 26 is an enlarged plan view illustrating a state in which the lead frame 30 illustrated in FIG. 23 is singulated.

In this step, as illustrated in FIG. 26, a part of the lead 4S is cut to cut off the lead 4S from the frame portion 30c. Also, in this step, a part of the plurality of suspension leads TL supporting the tab 3 is cut to cut off the tab 3 from the frame portion 30c. Also, a part of the lead 4G is cut to cut off the lead 4G from the frame portion 30c. Method of cutting is not particularly limited and the cutting can be done by press work or cutting work using a rotating blade.

According to the steps described in the foregoing, the semiconductor device 1 described with reference to FIGS. 1 to 9 can be obtained. Thereafter, needed inspections and tests such as visual inspection and electrical tests are performed and then the semiconductor device 1 is shipped or mounted on a mounting board not illustrated.

In the foregoing, the invention made by the inventor of the present invention has been concretely described based on the embodiments. However, it is needless to say that the present invention is not limited to the foregoing embodiments and various modifications and alterations can be made within the scope of the present invention.

First Modification Example

Figure 27:
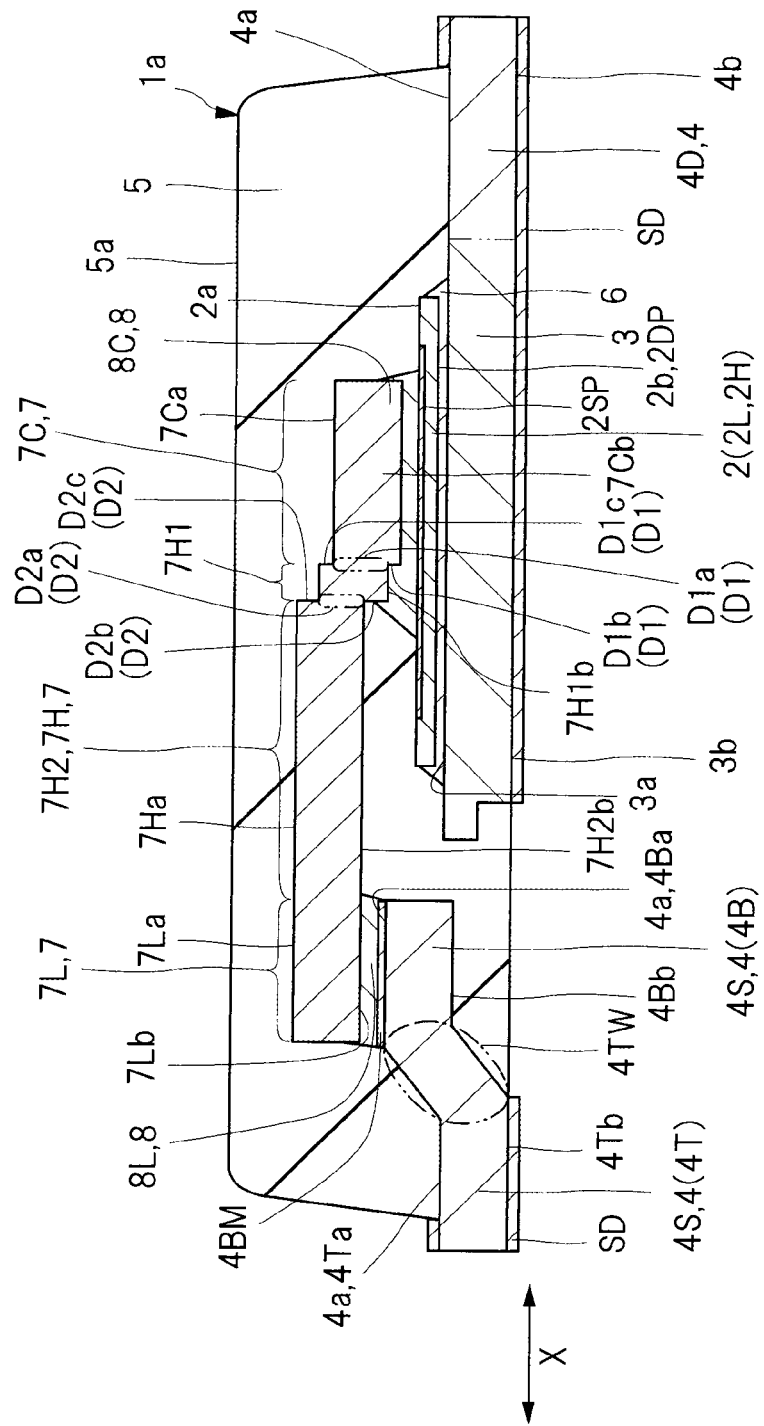
FIG. 27 is a cross-sectional view of a semiconductor device which is a modification example to that of FIG. 6.

While the metal clip 7 in which the step portion D1 is provided to one position between the intermediate portion 7H and the chip-connecting portion 7C has been described for example in the embodiment described in the foregoing, a plurality of step portions D1 and D2 can be provided like a semiconductor device 1a illustrated in FIG. 27. FIG. 27 is a cross-sectional view illustrated in FIG. the semiconductor device 1a that is a modification example of the semiconductor device 1 illustrated in FIG. 6.

To the metal clip 7 included in the semiconductor device 1a illustrated in FIG. 27, the plurality of step portions D1 and D2 are provided. In more details, the intermediate portion 7H of the metal clip 7 includes an intermediate portion 7H1 disposed on the chip-connecting portion 7C side and an intermediate portion 7H2 positioned between the intermediate portion 7H1 and the lead-connecting portion 7L. In addition, the step portion D1 is provided between the intermediate portion 7H1 and the chip-connecting portion 7C, and the step portion D2 is provided between the intermediate portion 7H1 and the intermediate portion 7H2. Further, a lower surface 7H2b of the intermediate portion 7H2 is disposed at a higher position than a lower surface 7H1b of the intermediate portion 7H1. The step portion D2 includes a joint portion D2a joining the intermediate portion 7H2 and the intermediate portion 7H1 and a shear surface D2b formed toward the front surface 2a of the semiconductor chip 2 from a lower end of the joint portion D2a and joined with the lower surface 7H1 of the intermediate portion 7H1. Also, the step portion D2 includes a shear surface D2c formed in a direction opposite to the semiconductor chip 2 from an upper end of the joint portion D2a and joined with the upper surface of the intermediate portion 7H1.

The configuration like the semiconductor device 1a in which the plurality of step portions D1 and D2 are provided to the metal clip 7 is effective when used in the case where the thickness of the semiconductor chip 2 is small. For example, the thickness of the semiconductor chip 2 illustrated in FIG. 27 is about 5011 μm. When the semiconductor chip 2 is thinned like this, the On resistance is lowered and thus this manner is advantageous in view of improving power conversion efficiency. However, when the thickness of the semiconductor chip 2 is reduced, in the case where the height difference of the connecting surface 4Ba of the lead 4S and the source electrode pad 2SP is large, the thickness of the joint portion D1a becomes thin when adjusting the height difference only by the step portion D1. In this case, there may be a concern of cutting-off depending on the strength of the joint portion D1a.

Accordingly, by providing the plurality of step portions D1 and D2 as illustrated in FIG. 27, the height difference of the connecting surface 4Ba of the lead 4S and the source electrode pad 2SP can be adjusted by the plurality of step portions D1 and D2. Thus, the thickness of each of the joint portions D1a and D2a can be increased. For example, in the example illustrated in FIG. 27, the thickness of the joint portion D1a is larger than the height of the shear surface D1b. Also, the thickness of the joint portion D2a is larger than the height of the shear surface D2b. In addition, in the example illustrated in FIG. 27, the thicknesses of the joint portions D1a and D2a are larger than the thickness of the semiconductor chip 2, respectively. In this manner, by providing the plurality of step portions D1 and D2, a lowering of the strength of the metal clip 7 can be suppressed.

In addition, the step portions D1 and D2 are formed by the shifting work method described above. Thus, as compared with the case of forming the bending portion 7TW like that illustrated in FIG. 30, area reduction of the retained surface 7Ha can be suppressed. For example, in the example illustrated in FIG. 27, the area of the upper surface of the intermediate portion 7H1 is smaller than that of the retained surface 7Ha of the intermediate portion 7H2.

In the example illustrated in FIG. 27, the lower surface 7H1b of the intermediate portion 7H1 is covered by the conductive bonding material 8C and also at least a part of the shear surface D2b of the step portion D2 is covered by the conductive bonding material 8C. In other words, the intermediate portion 7H1 of the metal clip 7 functions as a part of the chip-connecting portion 7C fixed to the source electrode pad 2SP of the semiconductor chip 2. That is, since the lower surface 7H1b of the intermediate portion 7H1 is in close contact with the conductive bonding material 8C, even when the area of the upper surface 7Ca of the chip-connecting portion 7C is reduced, bonding strength to the same extent as that of the semiconductor device 1 illustrated in FIG. 6 can be obtained. As a result, the area of the retained surface 7Ha of the intermediate portion 7H2 can be increased and thus alignment accuracy of the metal clip 7 can be improved in the clip-bonding step described above.

In view of controlling the level of spreading the conductive bonding material 8C, as illustrated in FIG. 27, it is preferable to make the length in the thickness direction of the shear surface D2b longer than the length in the thickness direction of the shear surface D1b. The level of suppressing the level of spreading the conductive bonding material 8C is varied by the length (height) in the thickness direction of the shear surfaces D1b and D2b. The longer the lengths in the thickness direction of the shear surfaces D1b and D2b, the larger the effect of controlling spread of the conductive bonding material 8C. Thus, by making the length of the shear surface D2b disposed on the lead-connecting portion 7L side relatively longer than the length of the shear surface D1b disposed on the chip-connecting portion 7C side, the intermediate portion 7H1 is covered by the conductive bonding material 8C and the conductive bonding material 8C can be fit into the area on the source electrode pad 2SP as illustrated in FIG. 27.

Since the semiconductor device 1a is the same as the semiconductor device 1 described above except for the differences described above, repetitive descriptions will be omitted.

Second Modification Example

Figure 28:
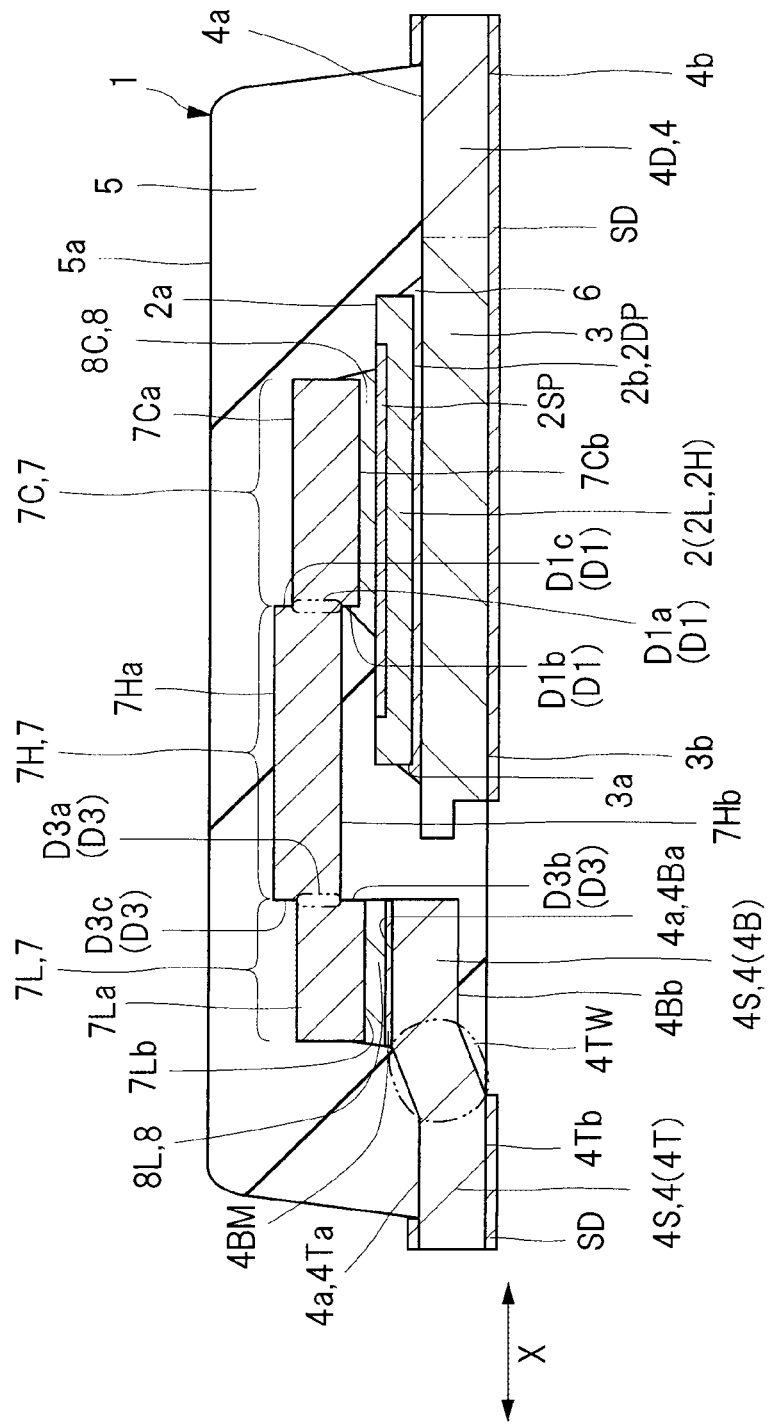
FIG. 28 is a cross-sectional view of a semiconductor device which is another modification example to that of FIG. 6.

The metal clip 7, in which the lower surface 7Hb of the intermediate portion 7H and the lower surface 7Lb of the lead-connecting portion 7L are disposed at the same height, has been described in the embodiment described above. However, for example, the lead-connecting portion 7L can be disposed at a lower position than the intermediate portion 7H like a semiconductor device 1b illustrated in FIG. 28. FIG. 28 is a cross-sectional view illustrating the semiconductor device 1b that is another modification example to the semiconductor device 1 illustrated in FIG. 6.

To the metal clip 7 included in the semiconductor device 1b illustrated in FIG. 28, a plurality of step portions D1 and D3 are provided and the intermediate portion 7H is disposed at a position higher than the lead-connecting portion 7L and the chip-connecting portion 7C in accordance with the step portions D1 and D3.

In more details, the lower surface 7Lb of the lead-connecting portion 7L of the metal clip 7 is provided at a lower position than the lower surface 7Hb of the intermediate portion 7H and the step portion D3 is provided between the lead-connecting portion 7L and the intermediate portion 7H. The step portion D3 includes a joint portion D3a joining the intermediate portion 7H and the lead-connecting portion 7L, a shear surface D3b formed downwards from a lower end of the joint portion D3a and joined with the lower surface 7Lb of the lead-connecting portion 7L, and a shear surface D3c formed upwards from an upper end of the joint portion D3a and joined with the lead-connecting portion 7L.

When the height of the connecting surface 4Ba of the connecting portion 4B is low, making the metal clip 7 as a flat plate material is considerable. However, it is preferable to raise the height of the intermediate portion 7H by providing the step portions D1 and D3 as illustrated in FIG. 28. In this manner, since the shear surface D1b is formed between the lower surface 7Cb of the lead-connecting portion 7C and the lower surface 7Hb of the intermediate portion 7H, as described above, the level of spreading of the conductive bonding material 8C can be controlled by the shear surface D1b.

In addition, in view of suppressing fall-off of the lead 4S from the sealant 5, the height of the connecting surface 4Ba of the connecting portion 4B is preferably higher than that of the upper surface 4Ta of the terminal portion 4T.

Since the semiconductor device 1b is the same as the semiconductor device 1 of the embodiment described above except for the point described above, repetitive descriptions will be omitted.

Third Modification Example

Figure 29:
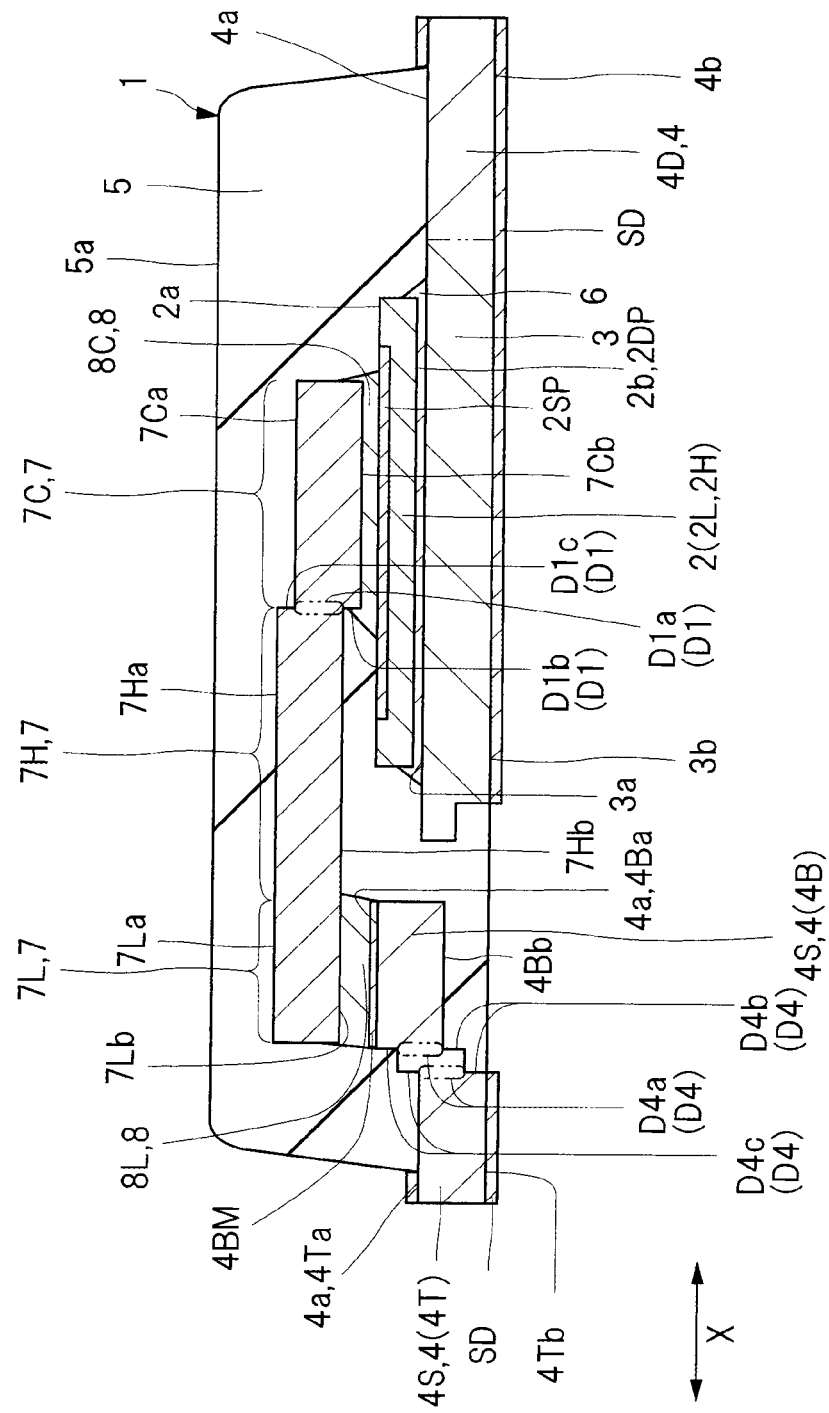
FIG. 29 is a cross-sectional view of a semiconductor device which is still another modification example to that of FIG. 6.

While an aspect of making the height of the connecting portion 4B high by the bending portion 4TW regarding the leads 4S and 4G has been described above, like a semiconductor device 1c illustrated in FIG. 29, a step portion D4 can be provided to the lead 4. FIG. 29 is a cross-sectional view illustrating the semiconductor device 1c that is still another modification example to the semiconductor device 1 in FIG. 6.

The lead 4S included in the semiconductor device 1c illustrated in FIG. 29 includes the terminal portion 4T exposed from the sealant 5, the connecting portion 4B to which the lead-connecting portion 7L of the metal clip 7 is connected, and the step portion D4 provided between the terminal portion 4T and the connecting portion 4B. The step portion D4 is formed by the shifting work method described above. The step portion D4 includes a joint portion D4a joining the connecting portion 4B and the terminal portion 4T, a shear surface D4b formed downwards from a lower end of the joint portion D4a and joined with the lower surface 4Tb of the terminal portion 4T, and a shear surface D4c formed upwards from an upper end of the joint portion D4a and joined with the connecting surface (upper surface) 4Ba of the connecting portion 4B. Note that, in FIG. 28, while an example of providing the plurality of (two) step portion D4 is described, the number of the step portions D4 can be determined in accordance with the height difference of the connecting surface 4Ba and the upper surface 4Ta.

In the aspect in which the height of the connecting portion 4B of the lead 4S is raised (increased) by the step portion D4 like the semiconductor device 1c, as compared with the case of providing the bending portion 4TW as illustrated in FIG. 6, the space for adjusting the height difference can be reduced and thus the planar size of the package, in other words, the mounting area can be reduced.

Fourth Modification Example

Moreover, while an aspect of embedding one semiconductor chip in one package has been described as a matter of simplicity in the embodiment described above, the number of mounted semiconductor chips may be plural. For example, this modification example can be used to the aspect of mounting the semiconductor chip 2H and the semiconductor chip 2L illustrated in FIG. 1 in one package.

Finally, although illustration is omitted, the modification examples can be used in combination.

What is claimed is:

1. A method of manufacturing a semiconductor device comprising the steps of:
    (a) preparing a lead frame including a chip-mounting portion having a chip-mounting surface, a first lead disposed to be separated from the chip-mounting portion, a second lead disposed to separate the chip-mounting portion and the first lead;
    (b) mounting a semiconductor chip to the chip-mounting portion via a first conductive bonding material, the semiconductor chip having a front surface to which a first electrode and a second electrode are formed and a back surface, positioned opposite to the front surface, to which a third electrode is formed;
    (c) electrically connecting the second electrode and the second lead via a metal plate having a chip-connecting portion, a lead-connecting portion, and an intermediate portion positioned between the chip-connecting portion and the lead-connecting portion;
    (d) electrically connecting the first electrode and the first lead via a wire; and
    (e) sealing the semiconductor chip, the metal plate, and the wire by a resin such that the first lead, the second lead, and the chip-mounting portion are partly exposed,
    wherein the metal plate prepared in the step (c) has:
        in a plan view, the chip connecting portion, the intermediate portion, and the lead-connecting portion disposed in this order from the second electrode of the semiconductor chip along a first direction,
    wherein forming the metal plate comprises forming a first step portion between the intermediate portion and the chip-connecting portion,
    the first step portion has:
        a first joint portion for joining the intermediate portion and the chip connecting portion, a first shear surface connected to a lower surface of the chip connecting portion, and a second shear surface formed on an opposite side of the first shear surface, and
    the step (c) includes the steps of:
        (c1) disposing a second conductive bonding material on the second electrode and a third conductive bonding material on the second lead, respectively;
        (c2) disposing the metal plate such that the chip connecting portion is positioned above the second conductive bonding material and the lead-connecting portion is positioned above the third conductive bonding material; and
        (c3) bonding the second electrode and the chip connecting portion via the second conductive bonding material and bonding the second lead and the lead-connecting portion via the third conductive bonding material.

2. The method of manufacturing a semiconductor device according to claim 1,
    wherein the metal plate has a first side surface and a second side surface disposed along the first direction and facing each other, and
    the first step portion is formed to connect the first and second side surfaces.

3. The method of manufacturing a semiconductor device according to claim 2,
    in the step (c), the second conductive bonding material covers a part of the first side surface and a part of the second side surface.

4. The method of manufacturing a semiconductor device according to claim 3, further comprising
 (f) after the step (c) and before the step (e), inspecting a connecting portion of the metal plate and the second electrode.

5. The method of manufacturing a semiconductor device according to claim 1,
 the second and third conductive bonding materials are solder, and
 in the step (c3), by melting the second and third conductive bonding materials, the second electrode and the chip-connecting portion are bonded via the second conductive bonding material, and the second lead and the lead-connecting portion are bonded via the third conductive bonding material.

6. The method of manufacturing a semiconductor device according to claim 1,
 wherein the second and third conductive bonding materials are conductive resins containing a plurality of conductive particles in resins each including a thermosetting resin.

7. The method of manufacturing a semiconductor device according to claim 1,
 wherein forming the first step portion comprises shifting positions of the intermediate portion and the chip-connecting portion in a thickness direction by conducting a press work on the intermediate portion and the chip-mounting portion while pressing each of them with an independent shearing jig.

* * * * *